(12) United States Patent
Kasahara et al.

(10) Patent No.: US 12,356,526 B2
(45) Date of Patent: Jul. 8, 2025

(54) LIGHT-EMITTING ELEMENT, DISPLAY DEVICE, AND ELECTRONIC EQUIPMENT

(71) Applicant: Sony Group Corporation, Tokyo (JP)

(72) Inventors: Naoya Kasahara, Kanagawa (JP); Akira Watanabe, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 1032 days.

(21) Appl. No.: 17/286,692

(22) PCT Filed: Nov. 14, 2019

(86) PCT No.: PCT/JP2019/044749
§ 371 (c)(1),
(2) Date: Apr. 19, 2021

(87) PCT Pub. No.: WO2020/105544
PCT Pub. Date: May 28, 2020

(65) Prior Publication Data
US 2021/0351266 A1    Nov. 11, 2021

(30) Foreign Application Priority Data
Nov. 19, 2018   (JP) ................................. 2018-216899

(51) Int. Cl.
*H10K 59/17* (2023.01)
*H05B 45/60* (2022.01)
(Continued)

(52) U.S. Cl.
CPC ........... *H05B 45/60* (2020.01); *H10K 50/813* (2023.02); *H10K 59/122* (2023.02);
(Continued)

(58) Field of Classification Search
CPC .. H10K 50/813; H10K 50/818; H10K 50/828; H10K 59/173; H10K 59/122;
(Continued)

(56) References Cited

U.S. PATENT DOCUMENTS

2007/0096124 A1    5/2007   Shin
2012/0187425 A1    7/2012   Omoto
(Continued)

FOREIGN PATENT DOCUMENTS

CN         1961617 A       5/2007
CN       101267701 A       9/2008
(Continued)

OTHER PUBLICATIONS

International Search Report (PCT/ISA/210), International Application No. PCT/JP2019/044749, dated Jan. 23, 2020.
(Continued)

*Primary Examiner* — Omar F Mojaddedi
(74) *Attorney, Agent, or Firm* — Michael Best & Friedrich LLP

(57) ABSTRACT

A light-emitting element according to the present disclosure includes an anode electrode portion having a projecting-shaped side wall portion formed along a peripheral edge portion of an organic EL pixel, an insulating film layer configured to cover an outer edge portion of the anode electrode portion so as to cover a side wall of the side wall portion on a light emitting unit side of the organic EL pixel in a predetermined film thickness, an organic EL layer layered so as to cover the insulating film layer and an upper surface of the anode electrode portion, and a cathode electrode portion layered over an upper surface of the organic EL layer.

18 Claims, 16 Drawing Sheets

(51) Int. Cl.
  *H10K 50/813* (2023.01)
  *H10K 50/818* (2023.01)
  *H10K 59/122* (2023.01)
  *H10K 59/173* (2023.01)
  *H10K 59/80* (2023.01)
  *H10K 77/10* (2023.01)
  *H10K 50/828* (2023.01)
  *H10K 102/00* (2023.01)

(52) U.S. Cl.
  CPC ..... *H10K 59/173* (2023.02); *H10K 59/80515* (2023.02); *H10K 77/10* (2023.02); *H10K 50/818* (2023.02); *H10K 50/828* (2023.02); *H10K 59/80518* (2023.02); *H10K 59/80524* (2023.02); *H10K 59/876* (2023.02); *H10K 2102/3026* (2023.02)

(58) Field of Classification Search
  CPC ....... H10K 59/80518; H10K 59/80524; H10K 59/876; H10K 59/80515; H10K 71/621; H10K 2102/3026; H05B 45/60
  See application file for complete search history.

(56) References Cited

U.S. PATENT DOCUMENTS

| | | | |
|---|---|---|---|
| 2012/0250303 A1 | 10/2012 | Asaki | |
| 2014/0332784 A1* | 11/2014 | Yokoyama | H10K 50/818 257/40 |
| 2014/0361253 A1 | 12/2014 | Choi | |
| 2015/0362776 A1* | 12/2015 | Jikumaru | H10K 50/865 349/12 |
| 2017/0294501 A1* | 10/2017 | Jang | H10K 59/122 |
| 2018/0166648 A1* | 6/2018 | Dai | H10K 50/813 |
| 2019/0172898 A1* | 6/2019 | Choi | H10K 50/822 |
| 2019/0280061 A1* | 9/2019 | Joo | H10K 50/84 |

FOREIGN PATENT DOCUMENTS

| | | | |
|---|---|---|---|
| CN | 102969329 A | 3/2013 |
| CN | 103367390 A | 10/2013 |
| CN | 106783928 A | 5/2017 |
| JP | 2001175200 A | 6/2001 |
| JP | 2003-17273 A | 1/2003 |
| JP | 2003017272 A | 1/2003 |
| JP | 2003077681 A | 3/2003 |
| JP | 2005-340011 A | 12/2005 |
| JP | 2007004997 A | 1/2007 |
| JP | 2007108248 A | 4/2007 |
| JP | 2008004290 A | 1/2008 |
| JP | 2008009408 A | 1/2008 |
| JP | 2008009409 A | 1/2008 |
| JP | 2008-225179 A | 9/2008 |
| JP | 2010056015 A | 3/2010 |
| JP | 2011138634 A | 7/2011 |
| JP | 2012174356 A | 9/2012 |
| JP | 2012216519 A | 11/2012 |
| JP | 2013044890 A | 3/2013 |
| JP | 2013058446 A | 3/2013 |
| JP | 2013238725 A | 11/2013 |
| JP | 2015011913 A | 1/2015 |
| JP | 2015046239 A | 3/2015 |
| JP | 2015060782 A | 3/2015 |
| JP | 2015138612 A | 7/2015 |
| JP | 2016-143585 A | 8/2016 |
| JP | 2017037825 A | 2/2017 |
| JP | 2017162832 A | 9/2017 |
| JP | 2018-92912 A | 6/2018 |
| WO | 2018/139171 A1 | 8/2018 |

OTHER PUBLICATIONS

Notification of Transmittal of the International Search Report and the Written Opinion of the International Searching Authority, or the Declaration (PCT/ISA/220), International Application No. PCT/JP2019/044749, dated Feb. 4, 2020.

Written Opinion of the International Search Authority (PCT/ISA/237), International Application No. PCT/JP2019/044749, dated Feb. 4, 2020.

Japanese Office Action dated Nov. 24, 2021 for corresponding Japanese Application No. 2020-558340.

* cited by examiner (A)

(B)

LIGHT-EMITTING ELEMENT, DISPLAY DEVICE, AND ELECTRONIC EQUIPMENT

TECHNICAL FIELD

The present disclosure relates to a light-emitting element, a display device, and electronic equipment.

BACKGROUND ART

In recent years, as an element used for a display device, an organic electroluminescence element (hereinafter, simply referred to as an "organic EL element") has been known.

The organic EL element is an element of a self-luminous type with low power consumption and a large contrast ratio. Accordingly, the organic EL element eliminates the necessity of use of an illuminating device, thereby allowing for a configuration of a thin, high-definition type display device with a low power consumption.

CITATION LIST

Patent Literature

[PTL 1]
Japanese Patent Laid-open No. 2013-044890

SUMMARY

Technical Problems

In the above-described conventional display device using an organic EL element, it has been recognized that a reduced efficiency of a light emission current and abnormal light emission are caused due to current leakage arising at a thinner portion of an organic EL layer at an opening end in a pixel configured as an organic EL element, causing reduction in luminance, increase in power consumption, and reduction in controllability of chromaticity.

The present invention has been made in view of the above-described circumstances and relates to a light-emitting element, a display device, and electronic equipment with high luminance and capable of reducing power consumption and enhancing controllability of chromaticity.

Solution to Problems

A light-emitting element according to an embodiment includes an anode electrode portion having a projecting-shaped side wall portion formed along a peripheral edge portion of an organic EL pixel, an insulating film layer configured to cover an outer edge portion of the anode electrode portion so as to cover a side wall of the side wall portion on a light emitting unit side of the organic EL pixel in a predetermined film thickness, an organic EL layer layered so as to cover the insulating film layer and an upper surface of the anode electrode portion, and a cathode electrode portion layered over an upper surface of the organic EL layer.

DESCRIPTION OF EMBODIMENTS

Preferable embodiments will now be described with reference to the drawings.

Figure 1:
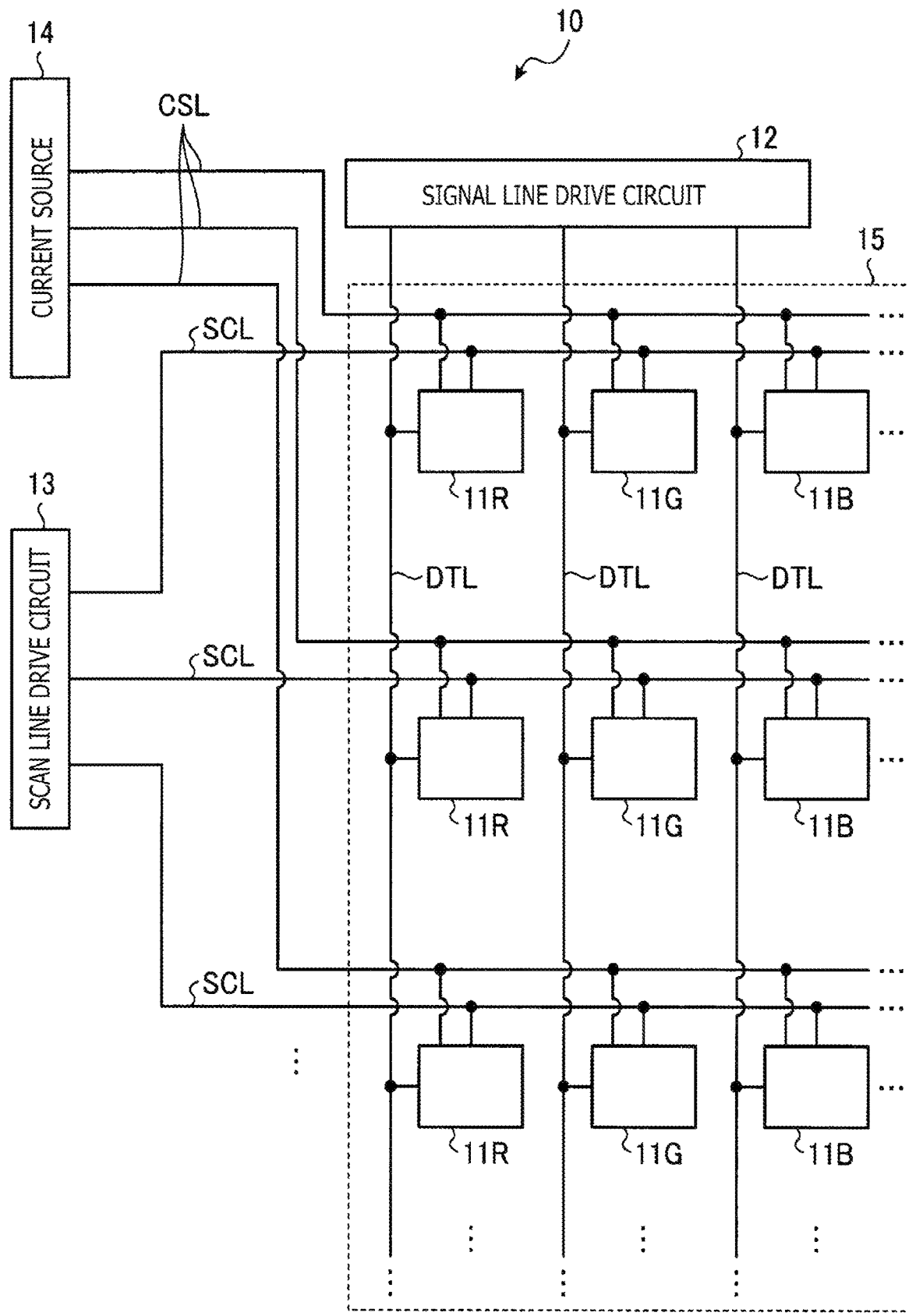
FIG. 1 is a block diagram illustrating a schematic configuration of a display device according to an embodiment.

FIG. 1 is a block diagram illustrating a schematic configuration of a display device according to an embodiment.

In a display device 10, a plurality of organic EL elements 11R each of which generates red light (R: a wavelength of 620 to 750 nm), a plurality of organic EL elements 11G each of which generates green light (G: a wavelength of 495 to 570 nm), and a plurality of organic EL elements 11B each of which generates blue light (B: a wavelength of 450 to 495 nm) are arranged in a matrix in a predetermined order.

In addition, the display device 10 includes a signal line drive circuit 12 for driving a signal line DTL connected to each of organic EL pixel elements 11R, 11G, and 11B, a scan line drive circuit 13 for driving a scan line SCL connected to each of the organic EL pixel elements 11R, 11G, and 11B, and a current source 14 supplying a current through a current supplying line CSL.

In the configuration described above, a region including all of the organic EL pixel elements 11R, 11G, and 11B constitutes a display region 15.

Figure 2:
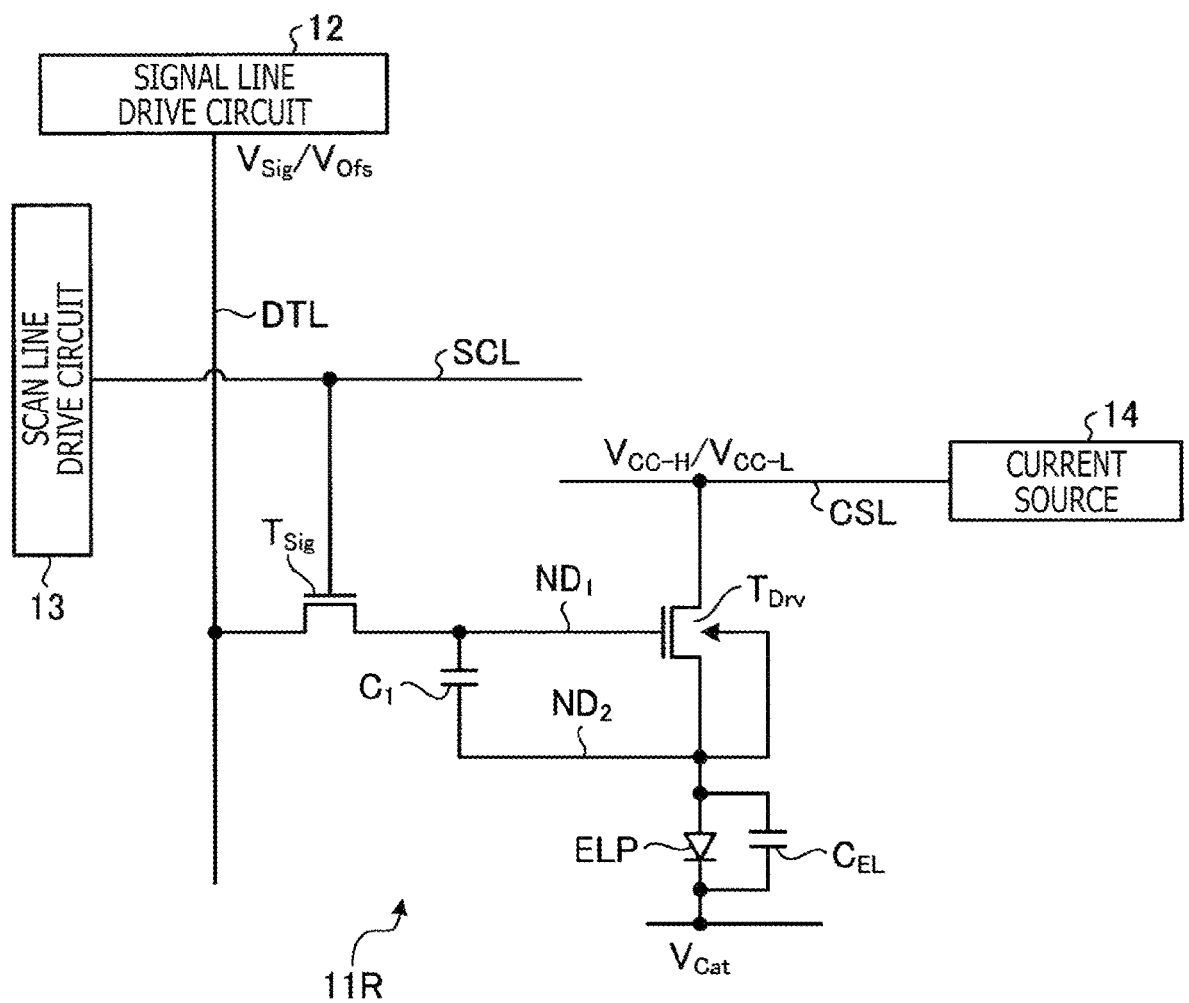
FIG. 2 is a diagram illustrating an equivalent circuit in a case in which a drive circuit of an organic EL pixel element is configured as a two-transistor/one-capacitor drive circuit.

FIG. 2 is a diagram illustrating an equivalent circuit in a case in which a drive circuit of an organic EL pixel element is configured as a two-transistor/one-capacitor drive circuit.

The two-transistor/one-capacitor drive circuit (hereinafter, referred to as a 2Tr/1C drive circuit) includes a video signal write transistor TSig a gate terminal of which is connected to a corresponding one of the scan lines SCL and which is driven by the scan line drive circuit 13, a drive transistor TDry which is switched on/off by the video signal write transistor TSig and drives a light emitting unit ELP of an induced EL element, and a capacitive unit C1.

In the above configuration, the drive transistor TDry and the video signal write transistor TSig are specifically configured as a MOSFET.

In the drive transistor TDrv, a drain terminal D is connected to the current supplying line CSL, and a source terminal S is connected to the light emitting unit ELP and also connected to one end of the capacitive unit C1 to constitute a second node $ND_2$. A gate terminal G of the drive transistor TDry is connected to a source terminal S of the video signal write transistor TSig and also connected to the other end of the capacitive unit C1 to constitute a first node $ND_1$.

In the video signal write transistor TSig, a drain terminal D is connected to the signal line DTL, and a gate terminal G is connected to the scan line SCL.

(1) First Embodiment

Figure 3:
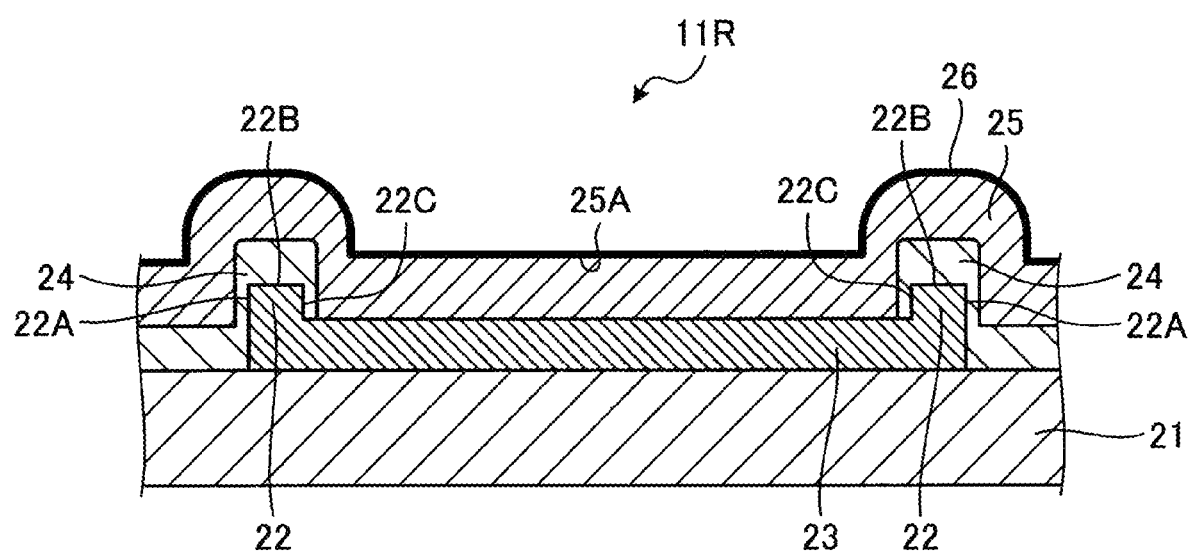
FIG. 3 is an explanatory diagram illustrating a basic configuration of an organic EL pixel element according to a first embodiment.

FIG. 3 is an explanatory diagram illustrating a basic configuration of an organic EL pixel element according to a first embodiment.

The organic EL pixel elements 11R, 11G, and 11B each have a similar configuration, and accordingly, the organic EL pixel element 11R will be described below by way of example.

The organic EL pixel element 11R includes a first insulating film layer (semiconductor substrate) 21, an anode electrode portion 23 having a side wall portion 22 formed in a projecting shape at a peripheral end of the anode electrode portion 23 on the first insulating film layer 21, a second insulating film layer 24 formed so as to cover an outer side wall portion 22A, an upper surface portion 22B, an inner side wall portion 22C of the side wall portion 22 of the electrode portion 23, an organic EL layer 25 layered so as to cover the second insulating film layer 24 and an upper surface of the electrode portion 23, and a cathode electrode portion 26 which is layered over an upper surface of the organic EL layer 25 and configured as a transparent electrode.

In the configuration described above, an example of a material forming the anode electrode portion 23 includes an aluminum alloy, a silver alloy, or the like.

Also, an example of a material forming the second insulating film layer 24 includes SiOx, SiON, SiN, AlOx, TaOx, HfOx, polyimide, or the like.

Here, an operation principle of the embodiment will be described.

First, a conventional problem will be described.

In the conventional technique, a leakage path (leakage current flow path) is formed in a thinner portion of an organic EL layer, and a hole injected from an anode electrode moves through the leakage path, thereby causing a leakage current to flow.

Consequently, the hole injected from the anode electrode does not contribute to light emission of the organic EL layer, reducing light emission efficiency. Moreover, the leakage current causes abnormal light emission at a portion for which light emission is not intended in the organic EL layer, causing abnormality in color.

Figure 4:
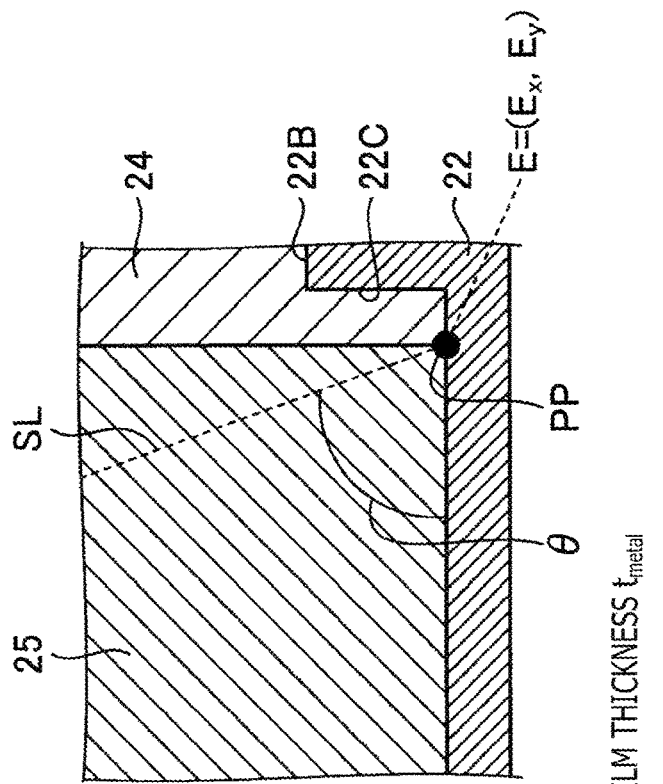
FIG. 4 depicts explanatory diagrams illustrating a principle of the embodiment.
Figure 4:
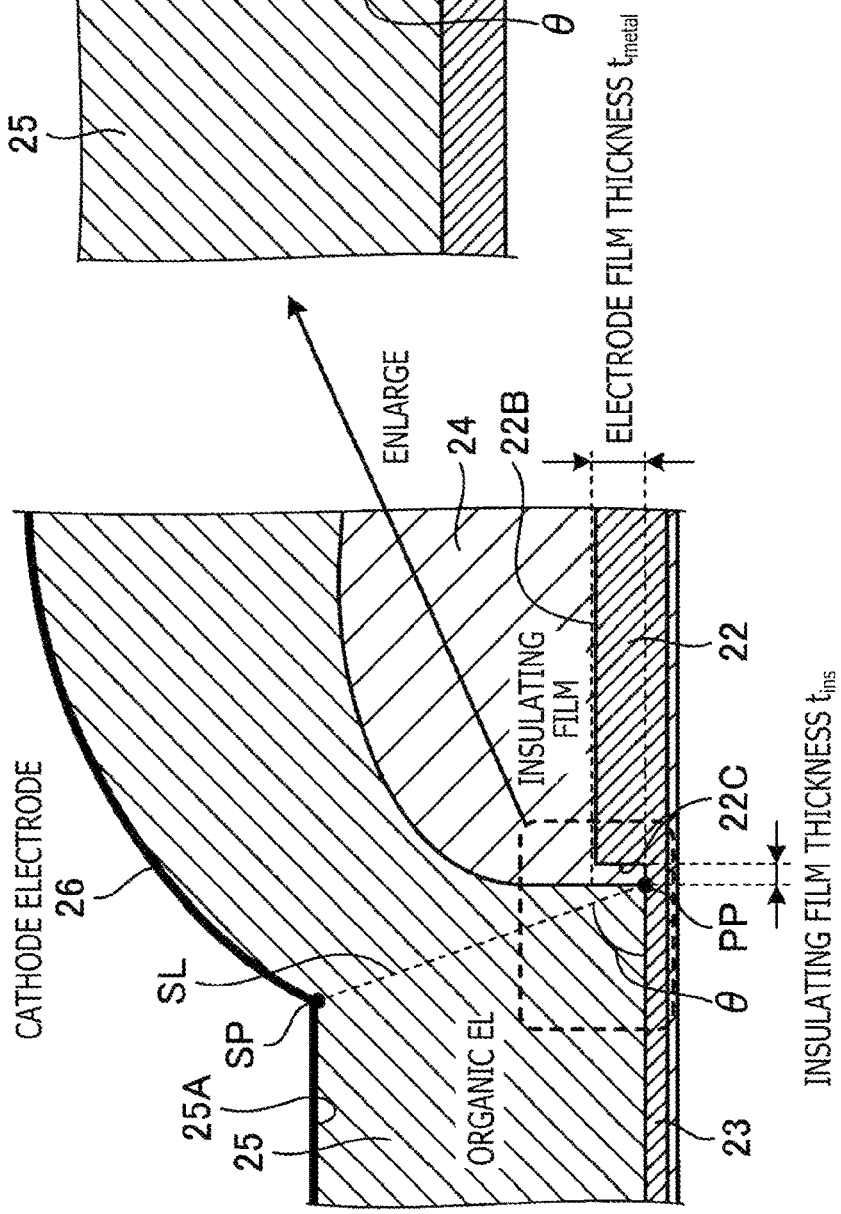

FIG. 4 depicts explanatory diagrams illustrating a principle of the embodiment.

To address the problem described above, in the first embodiment, the (second) insulating film layer 24 is formed so as to cover a pixel side wall, that is, the inner side wall portion 22C of the side wall portion 22. Formation of the insulating film layer 24 prevents hole injection from the side wall portion 22 of the anode electrode portion 23, thereby cutting off a leakage current.

Moreover, an electric field generated in the side wall portion 22 of the anode electrode portion 23 changes a moving direction in which a hole moves toward the cathode electrode portion 26 through the organic EL layer 25 from the anode electrode portion 23, to a side of a light-emitting surface 25A of the organic EL layer 25.

As a result, it becomes possible to suppress light emission occurring in a pixel side wall portion to prevent abnormality in color.

More specifically, upon drawing a straight line SL connecting from a point PP on a boundary between the anode electrode portion 23 and the insulating film layer 24 to the cathode electrode portion 26 at a shortest distance (shortest point SP), in a case in which an angle formed between the straight line SL and the upper surface of the anode electrode portion 23 is set to θ, a thickness tins (a film thickness of the insulating film: a thickness in a lateral direction in FIG. 4(a)) of the insulating film layer 24 which is opposed to the inner side wall portion 22C of the side wall portion 22 is set such that an angle formed between the upper surface of the anode electrode portion 23 and an electric field vector E formed in the point PP when a given potential difference is applied between the anode electrode portion 23 and the cathode electrode portion 26 is equal to or smaller than θ.

Thus, when the electric field vector E=(Ex, Ey) is assumed, the following expression is satisfied.

$$\arctan(Ey/Ex) \geq \theta$$

Consequently, the hole moves toward not the leakage path, but the light-emitting surface 25A of the organic EL layer 25 for which light emission is intended primarily, and accordingly, it becomes possible to suppress reduction of light emission efficiency and also to prevent abnormality in color.

A forming process of an anode electrode in the organic EL pixel element will next be described briefly.

Figure 5:
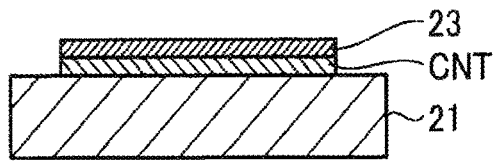
FIG. 5 depicts explanatory diagrams illustrating a manufacturing process of an anode electrode in the organic EL pixel element.
Figure 5:
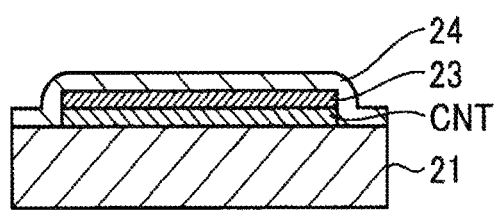
Figure 5:
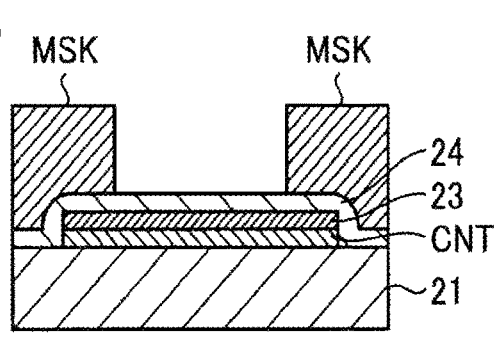
Figure 5:
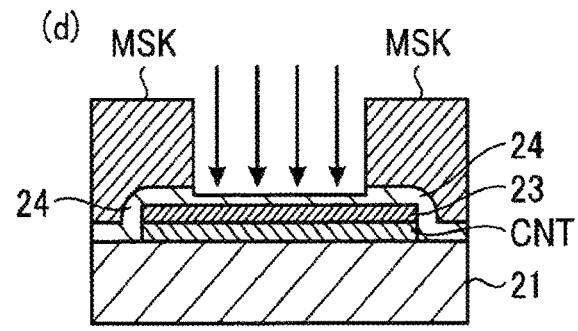
Figure 5:
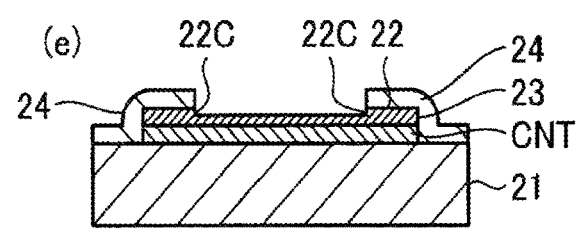
Figure 5:
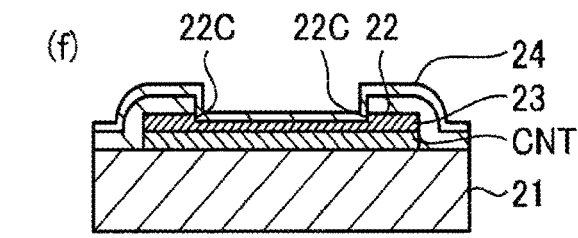
Figure 5:
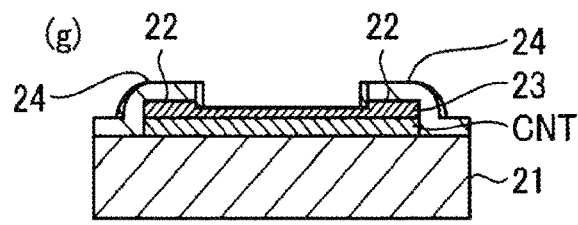

FIG. 5 depicts explanatory diagrams illustrating a manufacturing process of an anode electrode in the organic EL pixel element.

First, an anode electrode portion 23 is formed on the first insulating film layer (semiconductor substrate) 21 through a connecting layer CNT by a PVD (Plasma Vapor Deposition) method or the like (see FIG. 5(a)).

Subsequently, the second insulating film layer 24 is formed over the anode electrode portion 23 by a CVD (Chemical Vapor Deposition) method or the like (see FIG. 5(b)).

Moreover, a resist mask MSK is formed on some portions of the second insulating film layer 24 by photolithography (see FIG. 5(c)).

Next, etching is carried out, and the other portions of the second insulating film layer 24 with the resist mask MSK not formed thereon are removed by etching, and part of the anode electrode portion 23 is further removed by etching to form the side wall portion 22 (see FIG. 5(d)).

Consequently, the peripheral end of the anode electrode portion 23 has the side wall portion 22 formed thereon in a projecting shape (see FIG. 5(e)).

Then, the second insulating film layer 24 is formed again by the CVD method or the like so as to cover the inner side wall portion 22C of the side wall portion 22 (see FIG. 5(f)).

Subsequently, the whole surface of the second insulating film layer 24 thus formed is etched back to remove the second insulating film layer 24 on the upper surface side of the anode electrode portion 23, and accordingly, the upper surface side of the anode electrode portion 23 other than the side wall portion 22 is exposed (see FIG. 5(g)).

As described above, the anode electrode portion 23 having the side wall portion 22 is formed over the first insulating film layer (semiconductor substrate) 21.

Thereafter, the organic EL layer 25 is formed by vacuum vapor deposition or spin coating, and the cathode electrode portion 26 as a transparent electrode is further formed over the organic EL layer 25 by a spray method, a coating method, the CVD method, vacuum vapor deposition, sputtering, or the like. Then, the process is ended.

As a description given above, according to the organic EL pixel element of the first embodiment, it is possible to suppress reduction in light emission current efficiency due to current leakage in a thinner portion of the organic EL layer 25 at an opening end of the organic EL pixel element, and accordingly, high luminance and low power consumption can be achieved.

In addition, since abnormal light emission due to current leakage can be suppressed, controllability of chromaticity can be enhanced.

(2) Second Embodiment

Figure 6:
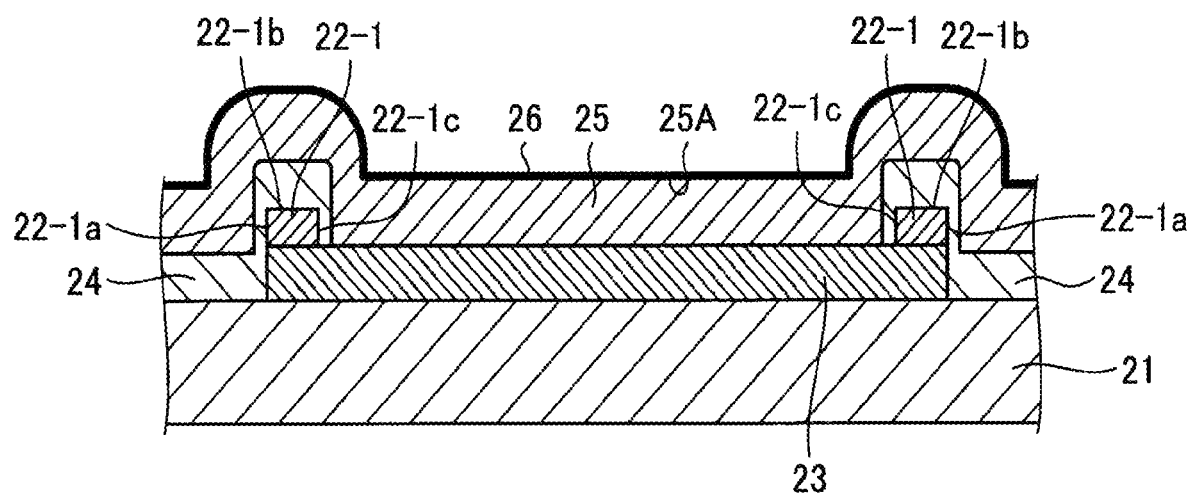
FIG. 6 is an explanatory diagram illustrating a basic configuration of an organic EL pixel element according to a second embodiment.

FIG. 6 is an explanatory diagram illustrating a basic configuration of an organic EL pixel element according to a second embodiment.

The organic EL pixel element in the second embodiment differs from that in the first embodiment in that a side wall portion 22-1 including an electrode material different from the electrode material of the anode electrode portion 23 is formed in place of the side wall portion 22 constituting the anode electrode portion 23 to thereby constitute the anode electrode portion 23.

In this case, the difference from the first embodiment is that a processing selectivity of the electrode material (referred to as an electrode material M1) forming a main body of the anode electrode portion 23 to the electrode material of the side wall portion 22-1 (referred to as an electrode material M2) is made higher in such a way that the electrode material M1 only is made to be processed, to thereby obtain enhancement of shaping stability of the side wall portion 22-1.

Here, an example of the electrode material M1 constituting the anode electrode portion 23 includes an aluminum alloy, a silver alloy, or the like.

Also, an example of the electrode material M2 constituting the side wall portion 22-1 of the anode electrode portion 23 includes indium tin oxide, indium oxide, indium-gallium-zinc-oxide, titanium oxide, titanium nitride, titanium, tantalum nitride, tantalum, or the like.

According to the second embodiment, in addition to advantageous effects of the first embodiment, the shaping stability of the side wall portion 22-1 is enhanced, and accordingly, current leakage at the thinner portion of the organic EL layer 25 at the opening end of the organic EL pixel element can be more reliably suppressed, so that advantageous effects similar to the first embodiment can be more reliably obtained.

(3) Third Embodiment

Figure 7:
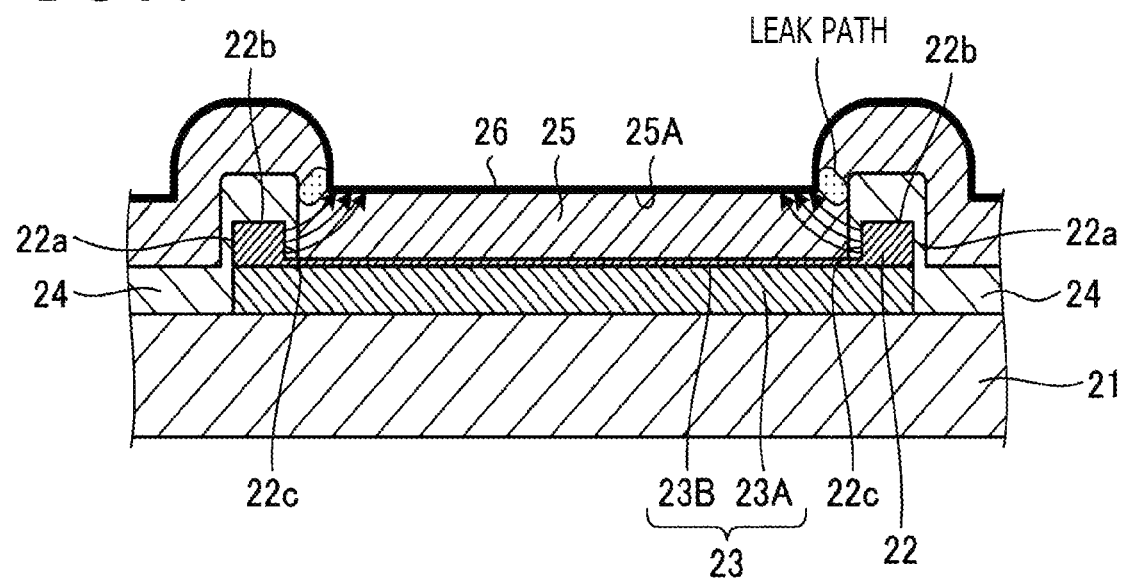
FIG. 7 is an explanatory diagram illustrating a basic configuration of an organic EL pixel element according to a third embodiment.

FIG. 7 is an explanatory diagram illustrating a basic configuration of an organic EL pixel element according to a third embodiment.

The organic EL pixel element in the third embodiment differs from that in the first embodiment in that an electrode portion 23B (a joining portion of the organic EL layer 25 and the anode electrode portion 23) formed on an upper layer of the anode electrode portion 23 and the side wall portion 22 include an electrode material different from the electrode material of the main body 23A of the anode electrode portion 23 to constitute the anode electrode portion 23.

In this case, the difference from the first embodiment is that the electrode material (referred to as the electrode material M1) of the main body 23A of the anode electrode portion 23 adopts a material having a high reflectance, and the electrode material (referred to as an electrode material M3) of the electrode portion 23B (the joining portion of the organic EL layer 25 and the anode electrode portion 23) of the anode electrode portion 23 and the side wall portion 22 adopts a material having a high carrier injection property into the organic EL layer 25, to thereby ensure a drive voltage and light emission efficiency of the organic EL pixel element.

More specifically, an example of the electrode material M1 constituting the main body 23A of the anode electrode portion 23 includes an aluminum alloy, a silver alloy, or the like.

Also, an example of the electrode material M3 constituting an upper layer portion 23B of the anode electrode portion 23 (the joining portion of the organic EL layer 25 and the anode electrode portion 23) and the side wall portion 22 includes indium tin oxide, indium oxide, indium-gallium-zinc-oxide, or the like.

According to the third embodiment, in addition to the advantageous effects of the first embodiment, it is possible to ensure a drive voltage and light emission efficiency of the organic EL pixel element.

(4) Fourth Embodiment

Figure 8:
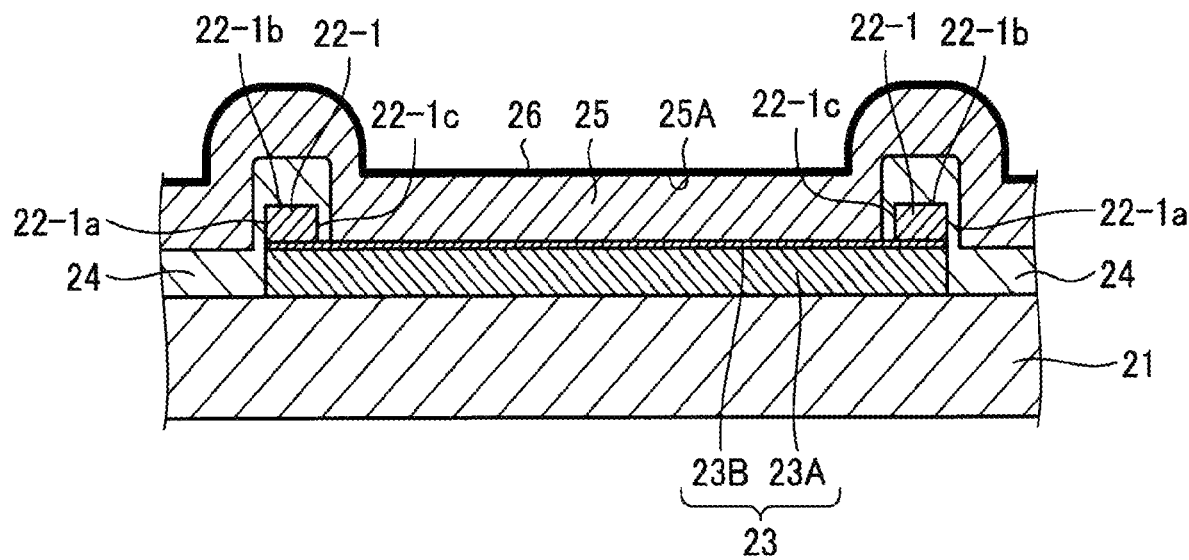
FIG. 8 is an explanatory diagram illustrating a basic configuration of an organic EL pixel element according to a fourth embodiment.

FIG. 8 is an explanatory diagram illustrating a basic configuration of an organic EL pixel element according to a fourth embodiment.

The organic EL pixel element in the fourth embodiment differs from that in the third embodiment in that the side wall portion 22-1 including an electrode material different from an electrode material of the electrode portion (a first characteristic layer) 23B (the joining portion of the organic EL layer 25 and the anode electrode portion 23) of the anode electrode portion 23 is formed in place of the side wall portion 22 to thereby constitute the anode electrode portion 23.

In this case, the electrode material M1 forming the main body 23A of the anode electrode portion 23 adopts a material having a high reflectance.

Also, the electrode material M2 of the electrode portion 23B (the joining portion of the organic EL layer 25 and the anode electrode portion 23) of the anode electrode portion 23 adopts a material having a high carrier injection property into the organic EL layer 25.

Moreover, the difference from the third embodiment is that an electrode material of the side wall portion 22-1 (referred to as the electrode material M3) adopts such a material having a high processing selectivity of the electrode material M2 to the electrode material M3 that the electrode material M2 only is made to be processed, to thereby obtain enhancement of shaping stability of the side wall portion 22-1.

In this case, an example of the electrode material M1 of the anode electrode portion 23 includes an aluminum alloy, a silver alloy, or the like.

Also, an example of the electrode material M2 of the upper layer portion 23B (the joining portion of the organic EL layer 25 and the anode electrode portion 23) of the anode electrode portion 23 includes indium tin oxide, indium oxide, indium-gallium-zinc-oxide, or the like.

Also, an example of the electrode material M3 constituting the side wall portion 22-1 includes indium tin oxide, indium oxide, indium-gallium-zinc-oxide, titanium oxide, titanium nitride, titanium, tantalum nitride, tantalum, or the like.

According to the fourth embodiment, in addition to advantageous effects of the third embodiment, the shaping stability of the side wall portion 22-1 is enhanced, and accordingly, current leakage at the thinner portion of the organic EL layer 25 at the opening end of the organic EL pixel element can be more reliably suppressed, so that advantageous effects similar to the first embodiment can be more reliably obtained.

(5) Fifth Embodiment

Figure 9:
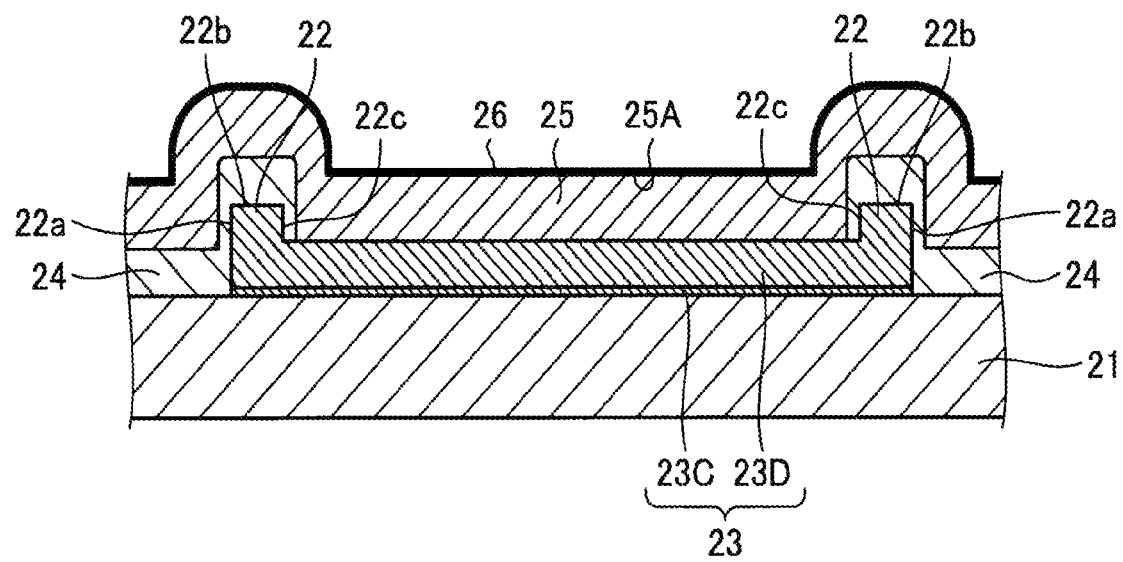
FIG. 9 is an explanatory diagram illustrating a basic configuration of an organic EL pixel element according to a fifth embodiment.

FIG. 9 is an explanatory diagram illustrating a basic configuration of an organic EL pixel element according to a fifth embodiment.

The organic EL pixel element in the fifth embodiment differs from that in the first embodiment in that a lower layer portion 23C (a joining portion of the anode electrode portion 23 and the first insulating film layer 21) of the anode electrode portion 23 includes an electrode material different from an electrode material of a main body 23D of the anode electrode portion 23 to constitute the anode electrode portion 23.

In this case, the electrode material (referred to as an electrode material M4) constituting the lower layer portion 23C (the joining portion of the anode electrode portion 23 and the first insulating film layer 21) of the anode electrode portion 23 adopts a material having high adhesiveness to the electrode material M1 forming the main body of the anode electrode portion 23 including the side wall portion 22 and to the first insulating film layer 21.

For example, an example of the electrode material M1 forming the main body of the anode electrode portion 23 including the side wall portion 22 includes an aluminum alloy, a silver alloy, or the like.

Also, an example of the electrode material M4) forming the lower layer portion 23C (the joining portion of the anode electrode portion 23 and the first insulating film layer 21) of the anode electrode portion 23 includes indium tin oxide, indium oxide, indium-gallium-zinc-oxide, titanium oxide, titanium nitride, titanium, tantalum nitride, tantalum, or the like.

According to the fifth embodiment, in addition to the advantageous effects of the first embodiment, it is possible to suppress the electrode material M1 forming the main body of the anode electrode portion 23 including the side wall portion 22 from being separated from the first insulating layer 21, so that the organic EL pixel element having a higher reliability can be configured.

(6) Sixth Embodiment

Figure 10:
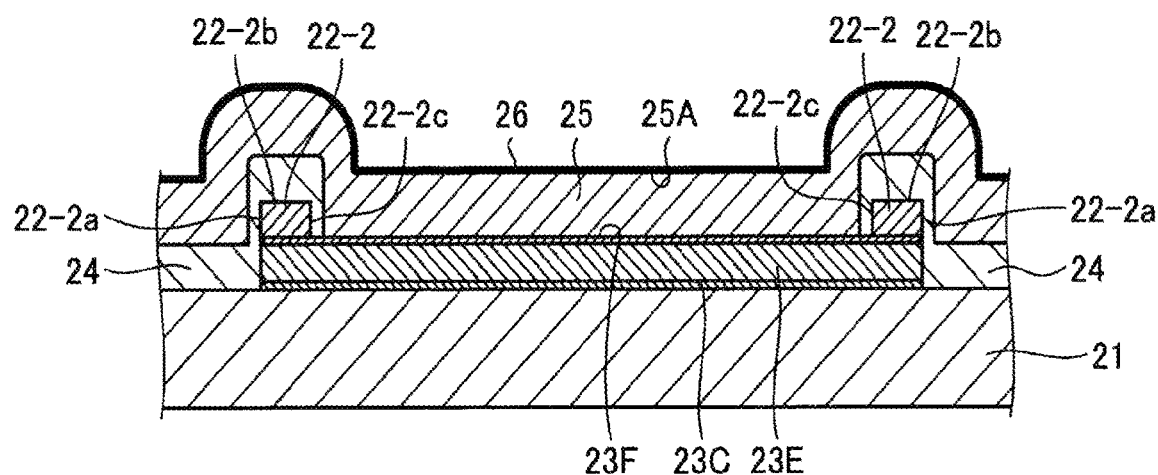
FIG. 10 is an explanatory diagram illustrating a basic configuration of an organic EL pixel element according to a sixth embodiment.

FIG. 10 is an explanatory diagram illustrating a basic configuration of an organic EL pixel element according to a sixth embodiment.

The organic EL pixel element in the sixth embodiment differs from that in the first embodiment in that a side wall portion 22-2 including an electrode material different from the electrode material of the upper layer portion 23B (the junction portion of the organic EL layer 25 and the anode electrode portion 23) of the anode electrode portion 23 is formed in place of the side wall portion 22, in that an upper layer portion 23F (the junction portion of the organic EL layer 25 and the anode electrode portion 23) of the anode electrode portion 23 includes an electrode material different from an electrode material of a main body 23E of the anode electrode portion 23, and in that a lower layer portion 23C (the junction portion of the anode electrode portion 23 and the first insulating film layer 21) of the anode electrode portion 23 includes an electrode material different from the electrode material of the main body 23E of the anode electrode portion 23.

In this case, a processing selectivity of the electrode material of the main body 23E of the anode electrode portion 23 (referred to as an electrode material M1) to the electrode material of the side wall portion 22-2 (referred to as the electrode material M2) is made high in such a manner that the electrode material M1 only is made to be processed, and thus, shaping stability of the side wall portion 22-2 is enhanced.

In addition, the electrode material M3 of the upper layer portion 23F (the junction portion of the organic EL layer 25 and the anode electrode portion 23) of the anode electrode portion 23 adopts a material having high carrier injection property into the organic EL layer 25.

Moreover, the electrode material forming the lower layer portion 23C (the junction portion of the anode electrode portion 23 and the first insulating film layer 21) of the anode electrode portion 23 (referred to as the electrode material M4) adopts a material having high adhesiveness to the electrode material M1 forming the main body 23E of the anode electrode portion 23 and to the first insulating film layer 21.

For example, an example of the electrode material M1 forming the main body 23E of the anode electrode portion 23 includes an aluminum alloy, a silver alloy, or the like.

In addition, an example of the electrode material M2 of the upper layer portion 23B (the junction portion of the organic EL layer 25 and the anode electrode portion 23) of the anode electrode portion 23 includes indium tin oxide, indium oxide, indium-gallium-zinc-oxide, or the like.

Moreover, an example of the electrode material M3 forming the side wall portion 22-1 includes indium tin oxide, indium oxide, indium-gallium-zinc-oxide, titanium oxide, titanium nitride, titanium, tantalum nitride, tantalum, or the like.

Further, an example of the electrode material M4) forming the lower layer portion 23C (the junction portion of the anode electrode portion 23 and the first insulating film layer 21) of the anode electrode portion 23 includes indium tin oxide, indium oxide, indium-gallium-zinc-oxide, titanium oxide, titanium nitride, titanium, tantalum nitride, tantalum, or the like.

According to the sixth embodiment, the advantageous effects of the first, third, fourth, and fifth embodiments can be obtained.

(7) Seventh Embodiment

Figure 11:
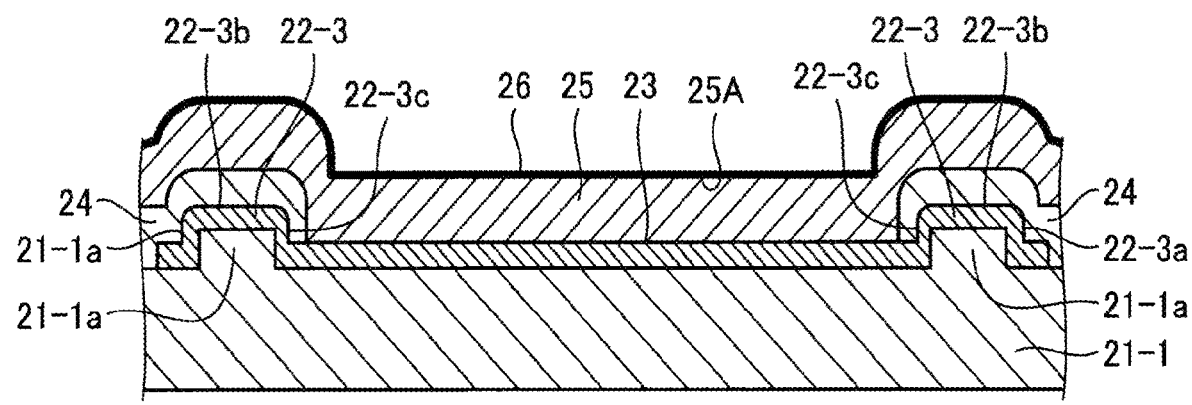
FIG. 11 is an explanatory diagram illustrating a basic configuration of an organic EL pixel element according to a seventh embodiment.

FIG. 11 is an explanatory diagram illustrating a basic configuration of an organic EL pixel element according to a seventh embodiment.

The organic EL pixel element in the seventh embodiment differs from that in the first embodiment in that a first insulating film layer 21-1 having a projecting portion 21-a for forming a side wall portion 22-3 is provided in place of the first insulating film layer 21 and an anode electrode portion 23 having such a shape as to cover an upper surface of the first insulating film layer 21-1 is formed.

According to the seventh embodiment, in addition to the advantageous effects of the first embodiment, it is possible to enhance processing controllability of the side wall portion 22-3 since the projecting portion 21-a is formed in the first insulating film layer 21-1 which is relatively easy to process and the anode electrode portion 23 is formed so as to cover the projecting portion 21-a.

(8) Eighth Embodiment

Figure 12:
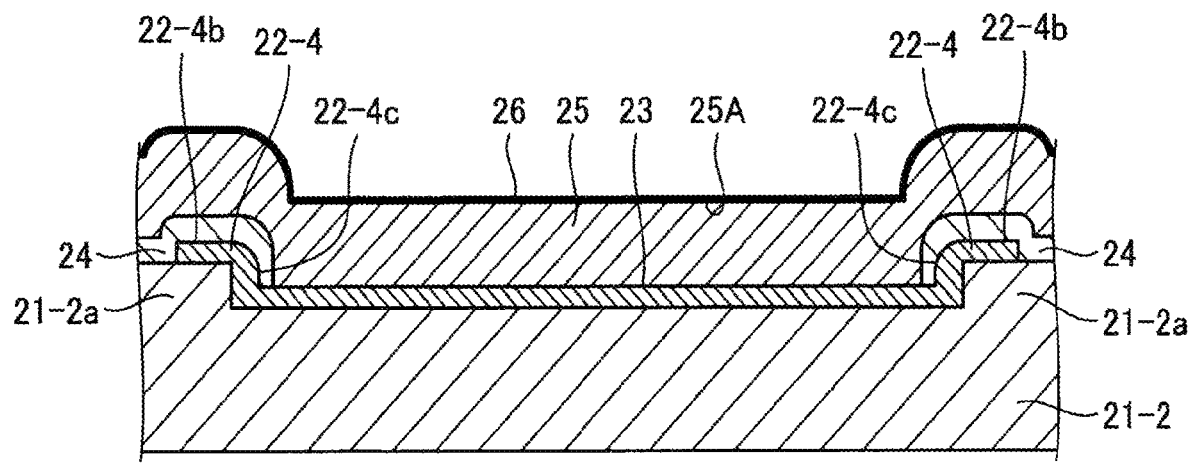
FIG. 12 is an explanatory diagram illustrating a basic configuration of an organic EL pixel element according to an eighth embodiment.

FIG. 12 is an explanatory diagram illustrating a basic configuration of an organic EL pixel element according to an eighth embodiment.

The organic EL pixel element in the eighth embodiment differs from that in the first embodiment in that a first insulating film layer 21-2 having a recess portion for forming the side wall portion 22-3 is provided in place of the first insulating film layer 21 and an anode electrode portion 23 having such a shape as to cover the upper surface of the first insulating film layer 21-1 is formed.

According to the eighth embodiment, in addition to the advantageous effects of the first embodiment, the recess portion is formed in the first insulating film layer 21-1 which is relatively easy to process and the anode electrode portion 23 is formed so as to cover the recess portion and the periphery of the recess portion, and accordingly, processing controllability of a side wall portion 22-4 can be enhanced much more than the case in the seventh embodiment.

(9) Example of Resonator Structure Applied to Each Embodiment

The organic EL pixel element to be used in the display apparatus according to the present disclosure described above can have a configuration in that a resonator structure which resonates light generated in the light emitting unit ELP is provided. In the following, the resonator structure will be described with reference to the drawings.

Resonator Structure: First Example

Figure 13:
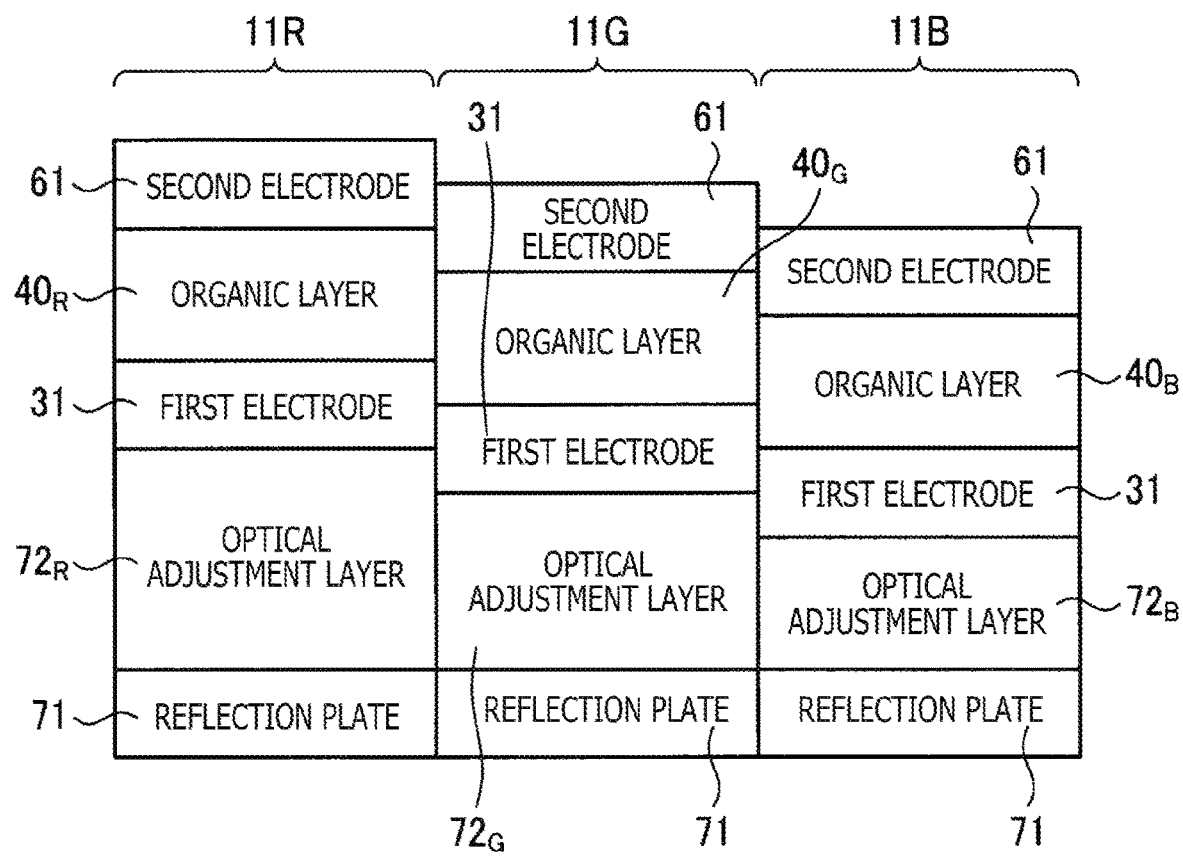
FIG. 13 is a schematic cross-sectional view for explaining a first example of a resonator structure.

FIG. 13 is a schematic cross-sectional view for explaining a first example of a resonator structure.

In the first example, respective first electrodes (anode electrode portions) 31 in the organic EL pixel elements 11R, 11G, and 11B are formed in a film thickness common to one another. This similarly applies to second electrodes (cathode electrode portions) 61 as well.

Under the first electrodes 31 in the organic EL pixel elements 11R, 11G, and 11B, respective reflection plates 71 are disposed with optical adjustment layers 72 (=$72_R$, $72_G$, and $72_B$) interposed therebetween. A resonator structure which resonates light generated in an organic layer 40 (=$40_R$, $40_G$, or $40_B$) is formed between each of the reflection plates 71 and each of the second electrodes 61.

The reflection plates 71 are formed in a film thickness common to one another in the respective light emitting units 50. Film thicknesses of the optical adjustment layers 72 are different from one another depending on a color to be displayed in each pixel. Since the optical adjustment layers $72_R$, $72_G$, and $72_B$ each have a different film thickness, it is possible to set an optical distance at which resonance most suitable to a wavelength of light according to the color to be displayed is generated.

In the example illustrated in the figure, upper surfaces of the reflection plates 71 in the organic EL pixel elements 11R, 11G, and 11B are disposed to be uniform. As described above, the film thicknesses of the optical adjustment layers $72_R$, $72_G$, and $72_B$ are different from one another depending on the color to be displayed, and accordingly, positions of upper surfaces of the second electrodes 61 are different from one another depending on a kind of the organic EL pixel element 11R, 11G, or 11B.

The reflection plate 71 can include a metal such as aluminum (Al), silver (Ag), or copper (Cu) or an alloy containing those metals as a main component.

The optical adjustment layers $72_R$, $72_G$, and $72_B$ can include inorganic insulating materials such as silicon nitride ($SiN_x$), silicon oxide ($SiO_x$), or silicon oxynitride ($SiO_xN_y$) or organic resin materials such as acrylic resin or polyimide resin. The optical adjustment layer 72 may be a single layer or may be a layered film including these plural materials. Alternatively, the number of layers of the optical adjustment layer 72 may vary according to a kind of the light emitting unit 50.

The first electrode 31 can include a transparent conductive material such as indium tin oxide (ITO), indium zinc oxide (IZO), or zinc oxide (ZnO).

The second electrode 61 needs to function as a semi-transmissive reflection film. The second electrode 61 can include magnesium (Mg), silver (Ag), a magnesium-silver alloy (MgAg) containing those materials as a main component, further an alloy containing alkali metal or alkaline earth metal, or the like.

Resonator Structure: Second Example

Figure 14:
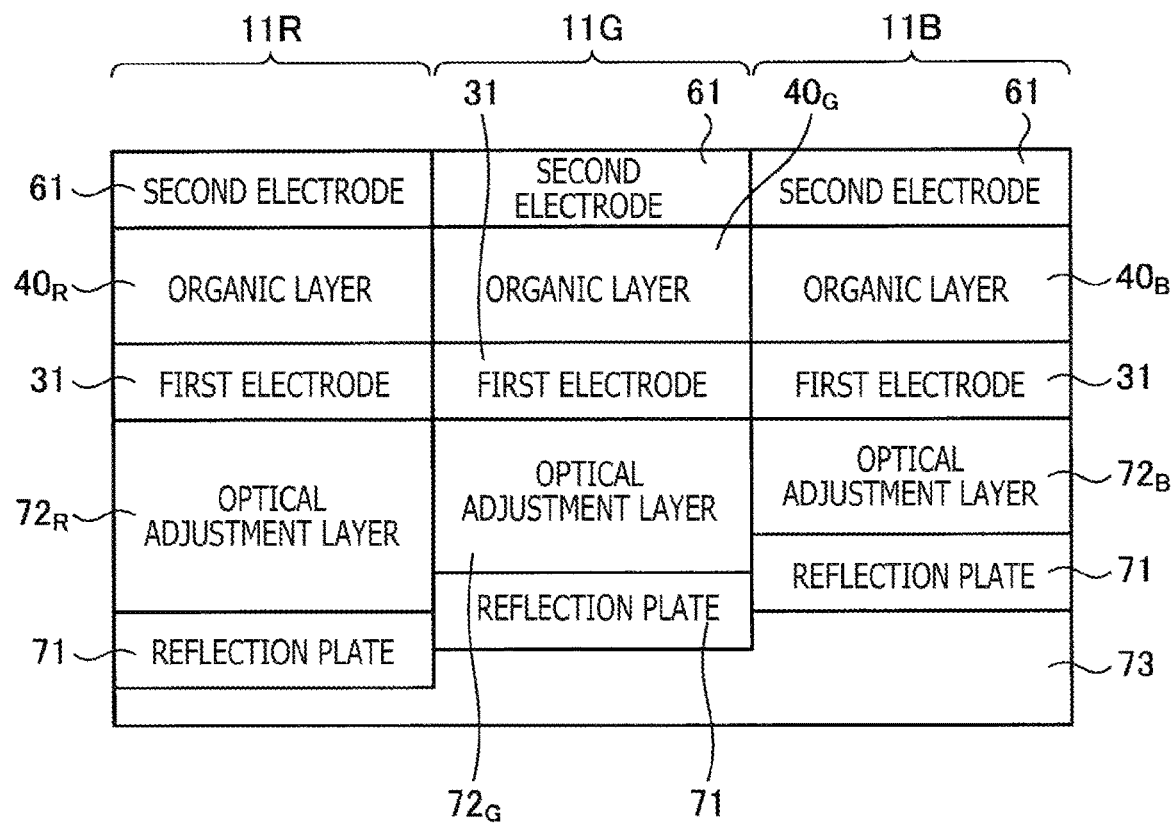
FIG. 14 is a schematic cross-sectional view for explaining a second example of a resonator structure.

FIG. 14 is a schematic cross-sectional view for explaining a second example of a resonator structure.

Also in the second example, the first electrodes 31 are formed to have a common film thickness in the light emitting units 50. This similarly applies to the second electrodes 61 as well.

Moreover, also in the second example, the reflection plate 71 is disposed under the first electrode 31 of the light emitting unit 50 with the optical adjustment layer 72 interposed therebetween. A resonator structure which resonates light generated in the organic layer 40 is formed between the reflection plate 71 and the second electrode 61. Similarly to the first example, the reflection plate 71 is formed in a common film thickness in each of the light emitting units 50, and the film thickness of the optical adjustment layer 72 varies according to the color to be displayed in each pixel.

In the first example illustrated in FIG. 13, the upper surfaces of the reflection plates 71 in the organic EL pixel elements 11R, 11G, and 11B are disposed so as to be uniform, and the positions of the upper surfaces of the second electrodes 61 are different from one another according to the kind of the organic EL pixel element 11R, 11G, or 11B.

In contrast, in the second example illustrated in FIG. 14, the upper surfaces of the second electrodes 61 are disposed so as to be uniform in the light emitting units $50_R$, $50_G$, and $50_B$. In order to make the upper surfaces of the second electrodes 61 uniform, the upper surfaces of the reflection plates 71 are disposed so as to be different from one another in the organic EL pixel elements 11R, 11G, and 11B according to the kind of the organic EL pixel element 11R, 11G, or 11B. Thus, each lower surface of the reflection plates 71 (in other words, a surface of a base layer 73 denoted by reference sign 73 in the figure) becomes a stepped shape according to the kind of the organic EL pixel element 11R, 11G, or 11B.

The materials configuring the reflection plate 71, the optical adjustment layer 72, the first electrode 31, and the second electrode 61, and the like are similar to the details described in the first example, and description thereof is omitted.

Resonator Structure: Third Example

Figure 15:
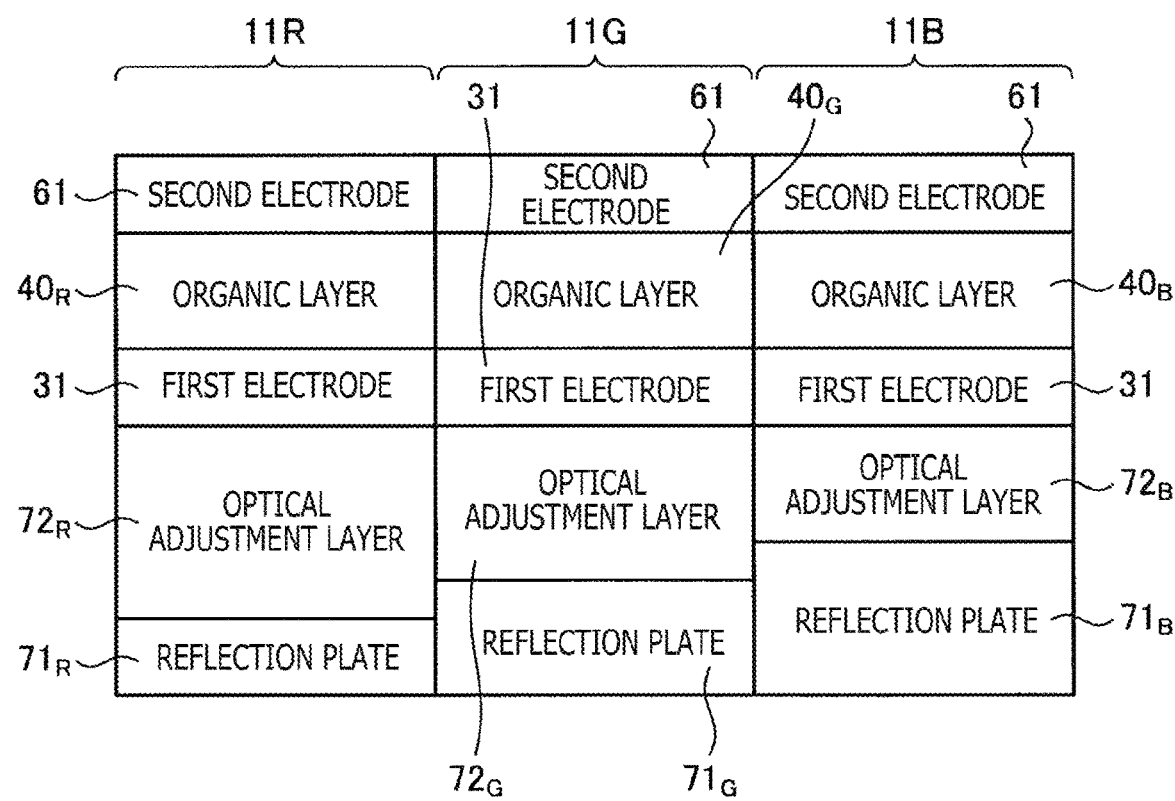
FIG. 15 is a schematic cross-sectional view for explaining a third example of a resonator structure.

FIG. 15 is a schematic cross-sectional view for explaining a third example of a resonator structure.

Also in the third example, the first electrodes 31 are formed to have a common film thickness in the organic EL pixel elements 11R, 11G, and 11B. This similarly applies to the second electrodes 61 as well.

Moreover, also in the third example, the reflection plate 71 (=$71_R$, $71_G$, or $71_B$) is disposed under the first electrode 31 of each of the organic EL pixel elements 11R, 11G, and 11B with the optical adjustment layer 72 (=$72_R$, $72_G$, or $72_B$) interposed therebetween. A resonator structure which resonates light generated in the organic layer 40 (=$40_R$, $40_G$, or $40_B$) is formed between the reflection plate 71 and the second electrode 61. Similarly to the first and second examples, film thicknesses of the optical adjustment layers $72_R$, $72_G$, and $72_B$ vary according to the color to be displayed in each pixel. Then, similarly to the second example, the positions of the upper surfaces of the second electrodes 61 are disposed so as to be uniform in the organic EL pixel elements 11R, 11G, and 11B.

In the second example illustrated in FIG. 14, in order to make the upper surfaces of the second electrodes 61 uniform, the lower surfaces of the reflection plates 71 are stepped shapes according to the kind of the organic EL pixel element 11R, 11G, or 11B.

In contrast, in the third example illustrated in FIG. 15, film thicknesses of the reflection plates 71 ($71_R$, $71_G$, and $71_B$) are set so as to be different from one another according to the kind of the organic EL pixel element 11R, 11G, or 11B. More specifically, the film thickness of each of the reflection plates 71 is set such that the lower surfaces of the reflection plates $71_R$, $71_G$, and $71_B$ are uniform.

The materials configuring the reflection plate 71, the optical adjustment layer 72, the first electrode 31, and the second electrode 61, and the like are similar to the details described in the first example, and description thereof is omitted.

Resonator Structure: Fourth Example

Figure 16:
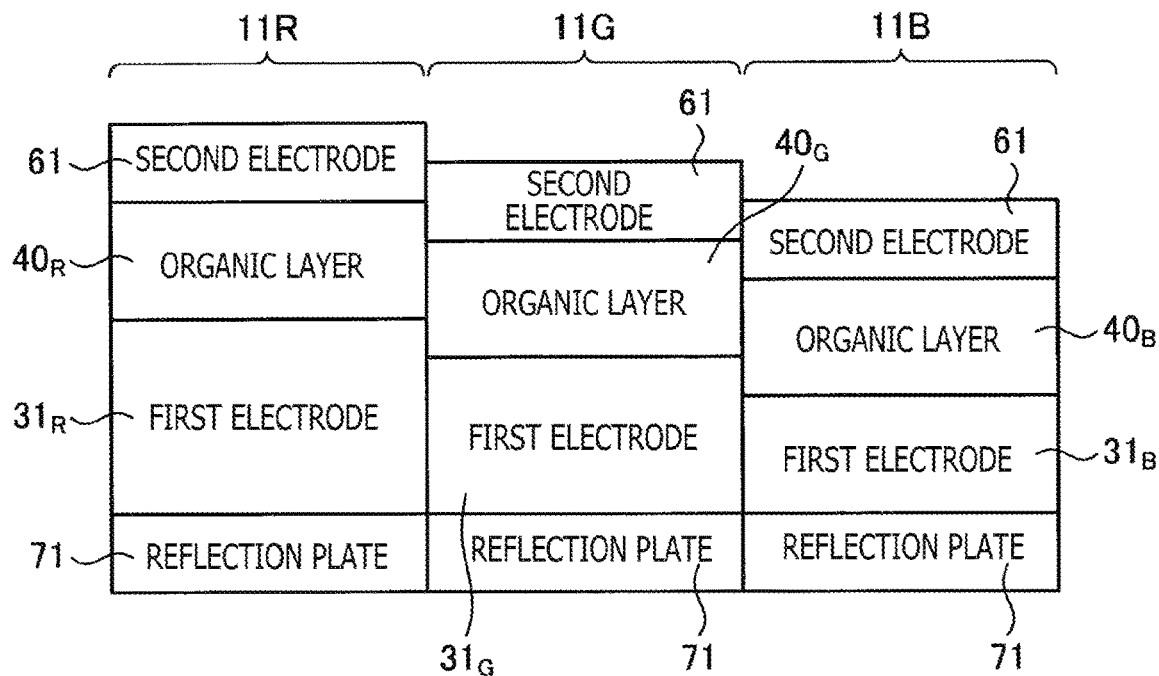
FIG. 16 is a schematic cross-sectional view for explaining a fourth example of a resonator structure.

FIG. 16 is a schematic cross-sectional view for explaining a fourth example of a resonator structure.

In the first example illustrated in FIG. 13, the first electrodes 31 are formed to have a common film thickness in the organic EL pixel elements 11R, 11G, and 11B, and this similarly applies to the second electrodes 61 as well. The reflection plates 71 are disposed under the first electrodes 31 of the organic EL pixel elements 11R, 11G, and 11B with the optical adjustment layers 72 interposed therebetween.

In contrast, in the fourth example illustrated in FIG. 16, the optical adjustment layers 72 are omitted, and the film thicknesses of the first electrodes 31 are set to be different from one another according to the kind of the organic EL pixel element 11R, 11G, or 11B.

The reflection plates 71 are formed to have a common film thickness in the organic EL pixel elements 11R, 11G, and 11B. The film thicknesses of the first electrodes $31_R$, $31_G$, and $31_B$ are different from one another according to the color to be displayed in each pixel. Since the first electrodes $31_R$, $31_G$, and $31_B$ have different film thicknesses, it is possible to set an optical distance at which resonance most suitable to a wavelength of light according to the color to be displayed is generated.

The materials configuring the reflection plate 71, the optical adjustment layer 72, the first electrode 31, and the second electrode 61, and the like are similar to the details described in the first example, and description thereof is omitted.

Resonator Structure: Fifth Example

Figure 17:
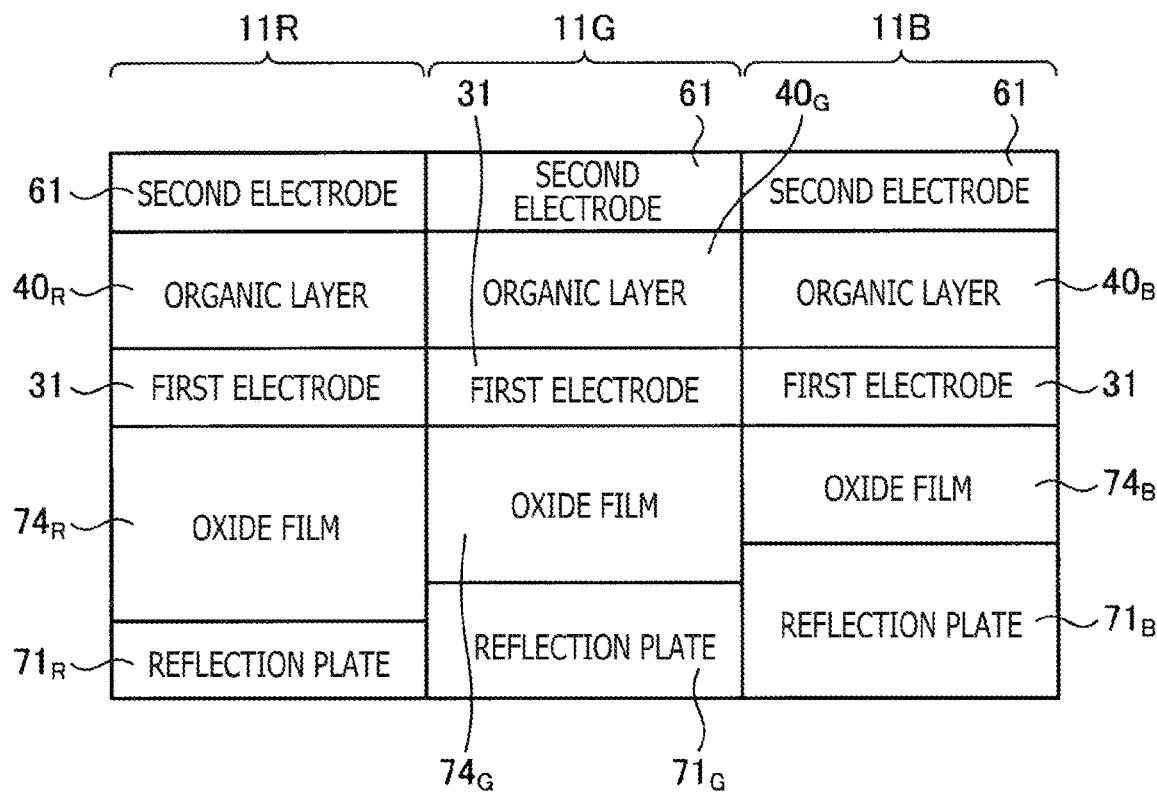
FIG. 17 is a schematic cross-sectional view for explaining a fifth example of a resonator structure.

FIG. 17 is a schematic cross-sectional view for explaining a fifth example of a resonator structure.

In the first example illustrated in FIG. 13, the first electrodes 31 are formed to have a common film thickness in the light emitting units 50, and this similarly applies to the second electrodes 61 as well. The reflection plate 71 is disposed under the first electrode 31 of each of the organic EL pixel elements 11R, 11G, and 11B with the optical adjustment layer 72 (=$72_R$, $72_G$, or $72_B$) interposed therebetween.

In contrast, in the fifth example illustrated in FIG. 17, the optical adjustment layer 72 (=$72_R$, $72_G$, and $72_B$) is omitted, and instead, an oxide film 74 (=$74_R$, $74_G$, and $74_B$) is formed over a front surface of the reflection plate 71. Film thicknesses of the oxide films $74_R$, $74_G$, and $74_B$ are set to be different from one another according to the kind of the organic EL pixel element 11R, 11G, or 11B.

The film thicknesses of the oxide films 74 are different according to the color to be displayed in each pixel. Since the oxide films $74_R$, $74_G$, and $74_B$ have different film thicknesses, it is possible to set an optical distance at which resonance most suitable to a wavelength of light according to the color to be displayed is generated.

The oxide film 74 is a film obtained by oxidizing the front surface of the reflection plate 71 and includes, for example, aluminum oxide, tantalum oxide, titanium oxide, magnesium oxide, zirconium oxide, or the like. The oxide film 74 functions as an insulating film for adjusting an optical path length (optical distance) between the reflection plate 71 and the second electrode 61.

The oxide films 74 with different film thicknesses according to the kind of the organic EL pixel element 11R, 11G, or 11B can be formed as follows, for example.

First, electrolytic solution is filled in a container, and a substrate formed with the reflection plate 71 is immersed into the electrolytic solution. In addition, an electrode is disposed so as to be opposed to the reflection plate 71.

Then, a positive voltage is applied to the reflection plate 71 with the electrode as a reference and anodizes the reflection plate 71. The film thickness of the oxide film thus obtained by the anodization is in proportion to a voltage value applied to the electrode. In view of this, anodization is conducted in a state in which a voltage according to the kind of the organic EL pixel element 11R, 11G, or 11B is applied to each of the reflection plates $71_R$, $71_G$, or $71_B$. Accordingly, it is possible to form the oxide films $74_R$, $74_G$, and $74_B$ with different film thicknesses collectively.

The materials configuring the reflection plate 71, the first electrode 31, and the second electrode 61, and the like are similar to the details described in the first example, and description thereof is omitted.

Resonator Structure: Sixth Example

Figure 18:
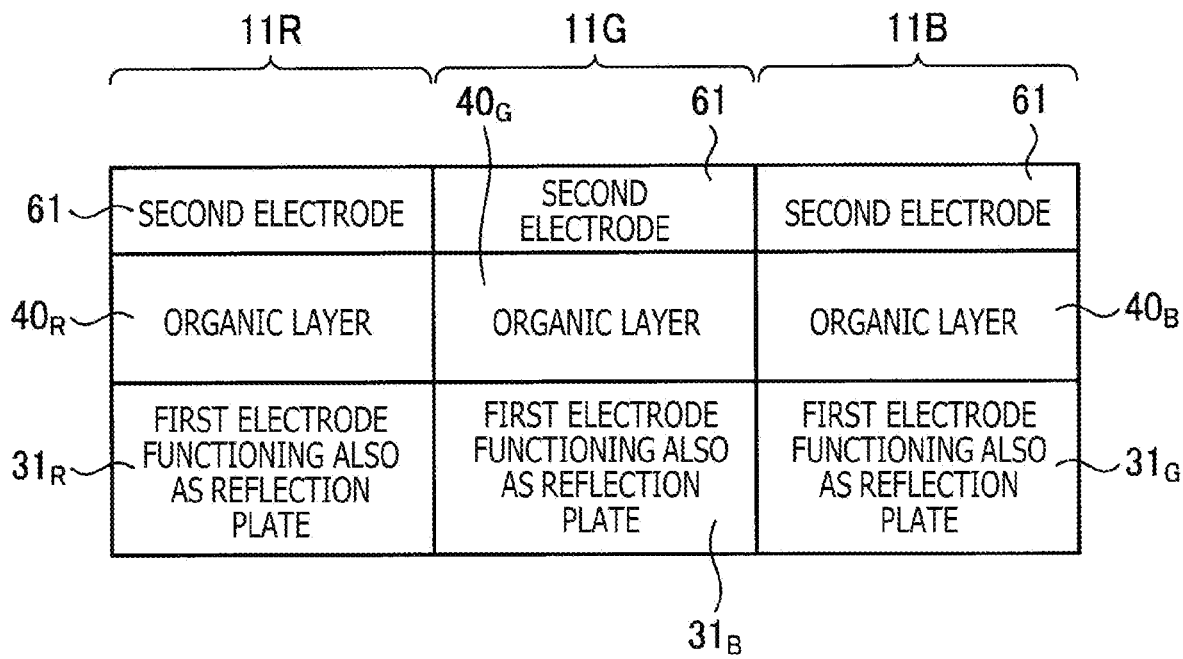
FIG. 18 is a schematic cross-sectional view for explaining a sixth example of a resonator structure.

FIG. 18 is a schematic cross-sectional view for explaining a sixth example of a resonator structure.

In the sixth example, the organic EL pixel elements 11R, 11G, and 11B are each configured in such a manner that the first electrode 31, the organic layer 40, and the second electrode 61 are layered. Note that, in the sixth example, the first electrode 31 is formed to function both as the electrode and the reflection plate. Accordingly, the first electrode (also functioning as the reflection plate) 31 (=$31_R$, $31_G$, or $31_{13}$) includes a material having an optical constant selected according to the kind of the organic EL pixel element 11R, 11G, or 11B. Phase shifts caused by the first electrodes (also functioning as the reflection plates) 31 are different, and accordingly, an optical distance at which resonance most suitable to a wavelength of light according to the color to be displayed is generated can be set.

The first electrodes (also functioning as the reflection plates) 31 can include a metal such as aluminum (Al), silver (Ag), gold (Au), or copper (Cu), or an alloy containing those metals as a main component. For example, the first electrode (also functioning as the reflection plate) $31_R$ in the organic EL pixel element 11R can include copper (Cu), while the first electrode (also functioning as the reflection plate) $31_G$ in the organic EL pixel element 11G and the first electrode (also functioning as the reflection plate) $31_B$ in the organic EL pixel element 11B can include aluminum.

The material of the second electrode 61, and the like are similar to the details described in the first example, and accordingly, description thereof is omitted.

Resonator Structure: Seventh Example

Figure 19:
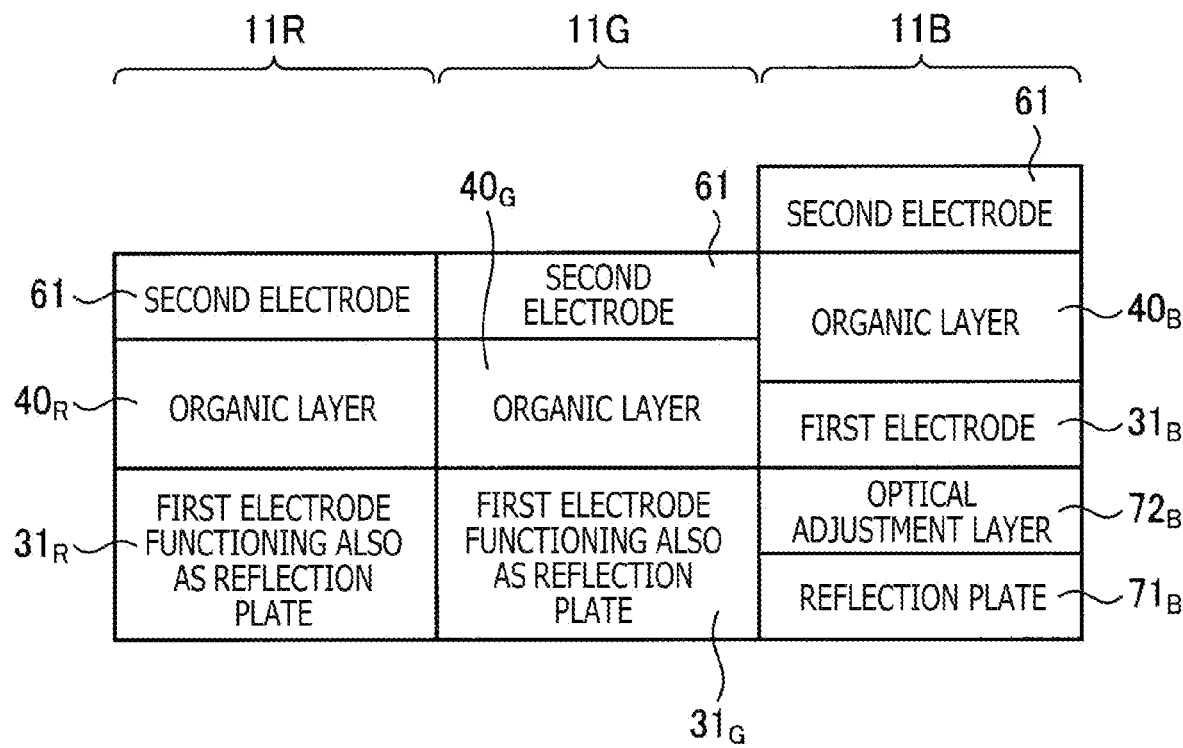
FIG. 19 is a schematic cross-sectional view for explaining a seventh example of a resonator structure.

FIG. 19 is a schematic cross-sectional view for explaining a seventh example of a resonator structure.

In the seventh example, basically, the organic EL pixel elements 11R and 11G adopt the same configuration as in the sixth example, and the organic EL pixel element 11B adopts the same configuration as in the first example. Also in this configuration, it is possible to set an optical distance at which resonance most suitable to a wavelength of light according to the color to be displayed is generated.

The first electrodes (also functioning as the reflection plates) $31_R$ and $31_G$ to be used in the organic EL pixel elements 11R and 11G can include a metal such as aluminum (Al), silver (Ag), gold (Au), or copper (Cu), or an alloy containing those metals as a main component.

The materials of the reflection plate $71_B$, the optical adjustment layer $72_B$, and the first electrode $31_B$ to be used in the organic EL pixel element 11B, and the like are similar to the details described in the first example, and accordingly, description thereof is omitted.

Figure 20:
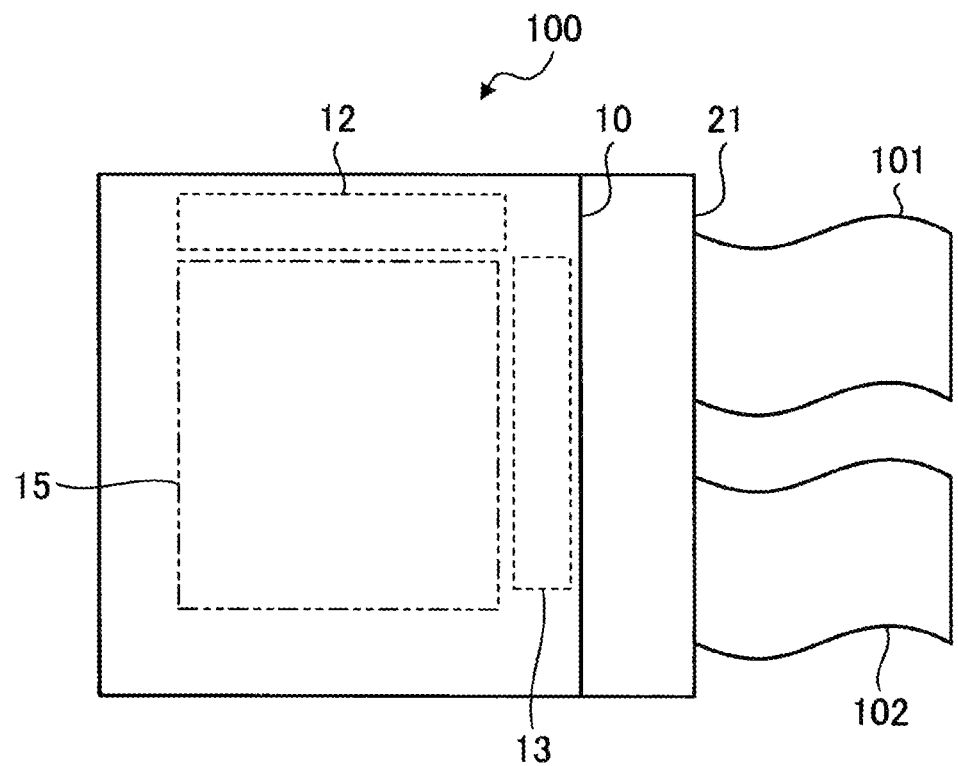
FIG. 20 is an explanatory view of an external appearance of a display module.

FIG. 20 is an explanatory view of an external appearance of a display module.

The display device 10 of each of the embodiments described above is, for example, incorporated in various types of electric equipment such as those in application examples 1 to 5 described later, as a display module 30 described in FIG. 20. The display module 30 is suitable to viewfinders of a video camera and a single-lens reflex camera, a head mounted display, or other devices for which high resolution is required and which are used magnifying an image at a position close to an eye.

The display module 30 has, for example, an external connection terminal (not illustrated) formed at one end of a sealing substrate 21 by extending wires of the signal line drive circuit 12 and the scan line drive circuit 13 of the display device 10 to have a flexible printed circuit (FPC) 31 for input/output of signals provided to the external connection terminal. Note that the display module 30 can be configured to route wiring to the external connection terminal provided at the one end of the sealing substrate 21 without providing the flexible printed circuit 31.

Application Example 1

Figure 21:
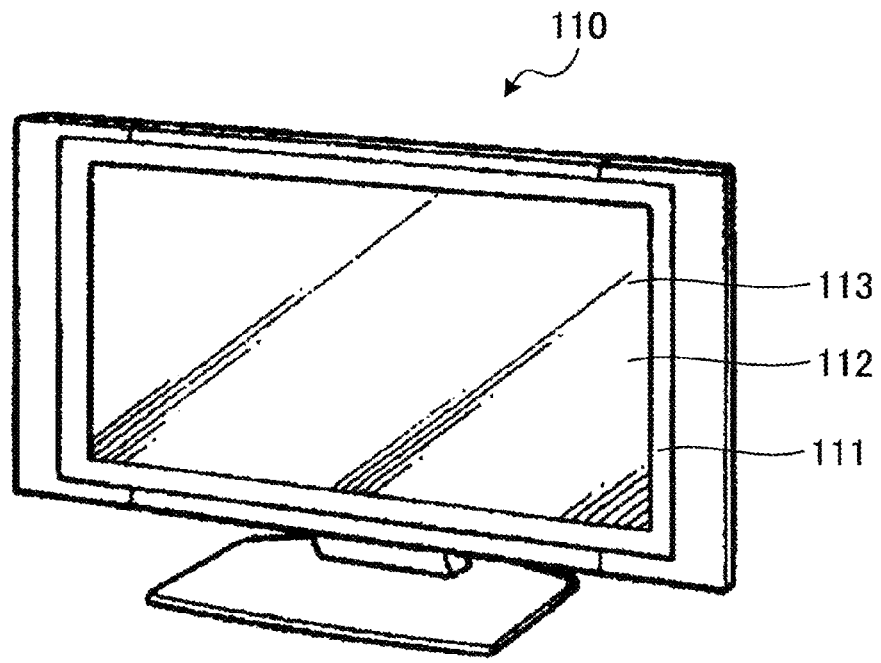
FIG. 21 is an explanatory view of an external appearance of a display to which the display device according to the embodiments is applied.

FIG. 21 is an explanatory view of an external appearance of a display to which the display device according to the embodiments is applied.

A display (including a television set) 40 has, for example, a video display screen section 43 including a front panel 41 and a filter glass 42, and the video display screen section 43 includes the display device 10 according to each of the embodiments.

Application Example 2

Figure 22:
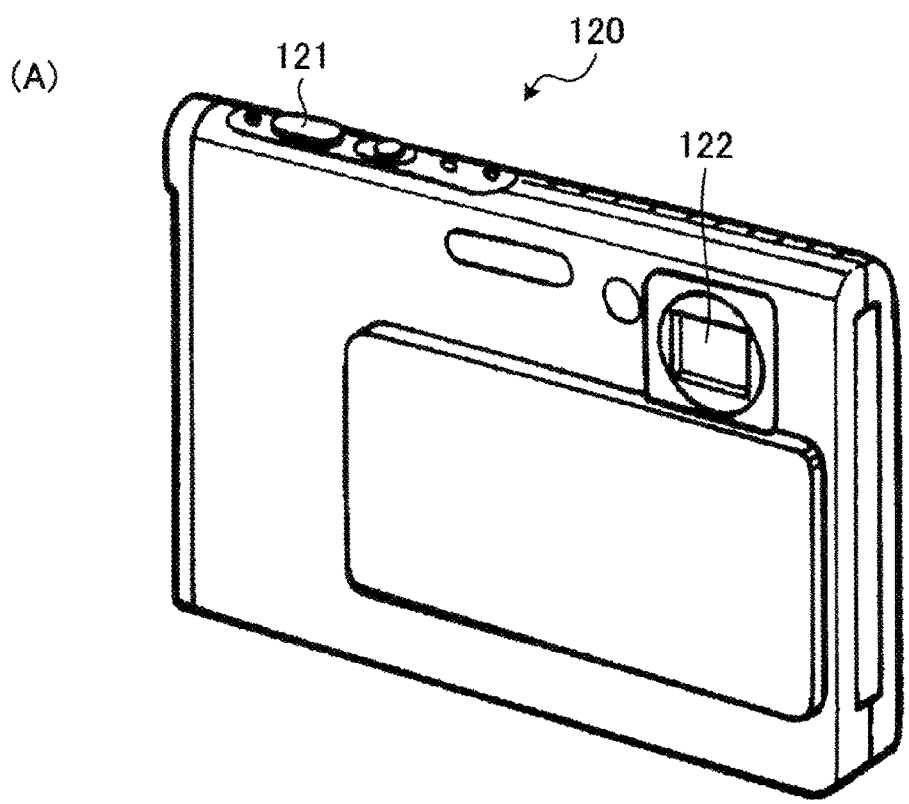
FIG. 22 depicts explanatory views of an external appearance of a digital camera to which the display device according to the embodiments is applied.
Figure 22:
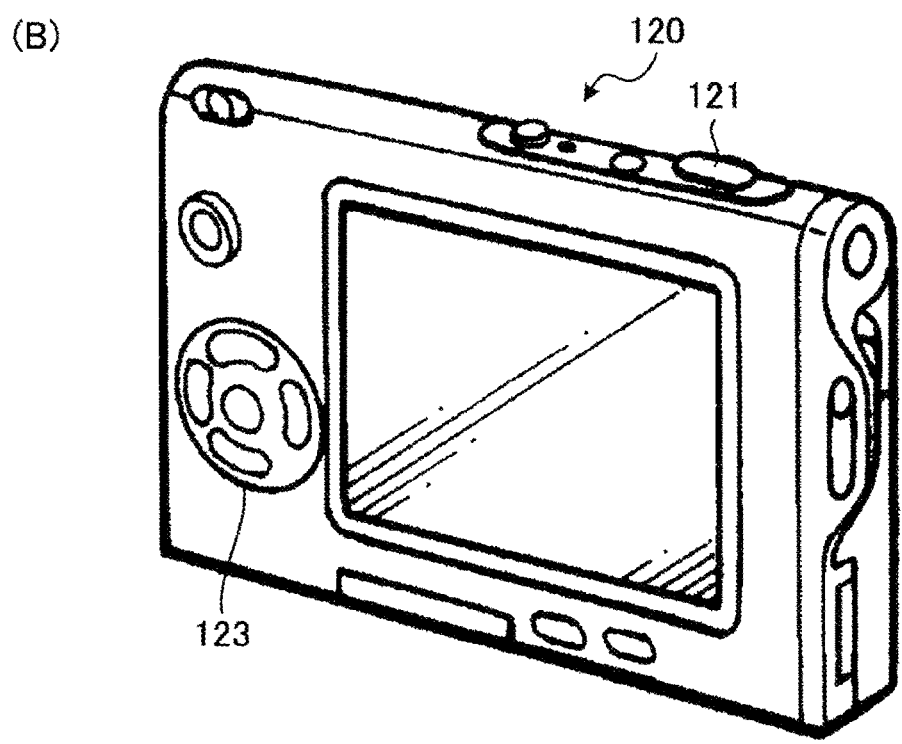
Figure 23:
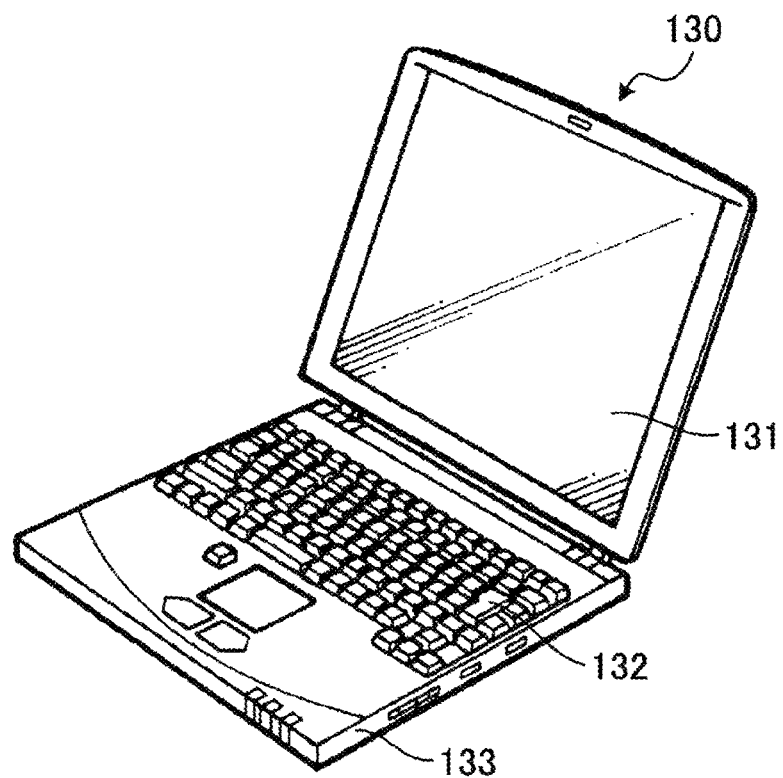
FIG. 23 is an explanatory view of an external appearance of a laptop personal computer to which the display device according to the embodiments is applied.

FIG. 22 depicts explanatory views of an external appearance of a digital camera to which the display device according to the embodiments is applied.

A digital camera 50 has, for example, a shutter button 51, a light emitting unit for flash 52, a display device 10, a menu switch 53.

Application Example 3

FIG. 19 is an explanatory view of an external appearance of a laptop personal computer to which the display device according to the embodiments is applied.

A laptop personal computer 60 has, for example, a display section 61, a keyboard 62 for input operation of characters or the like, and a main body section 63, and the display section 61 includes the display device 10 according to each of the embodiments.

Application Example 4

Figure 24:
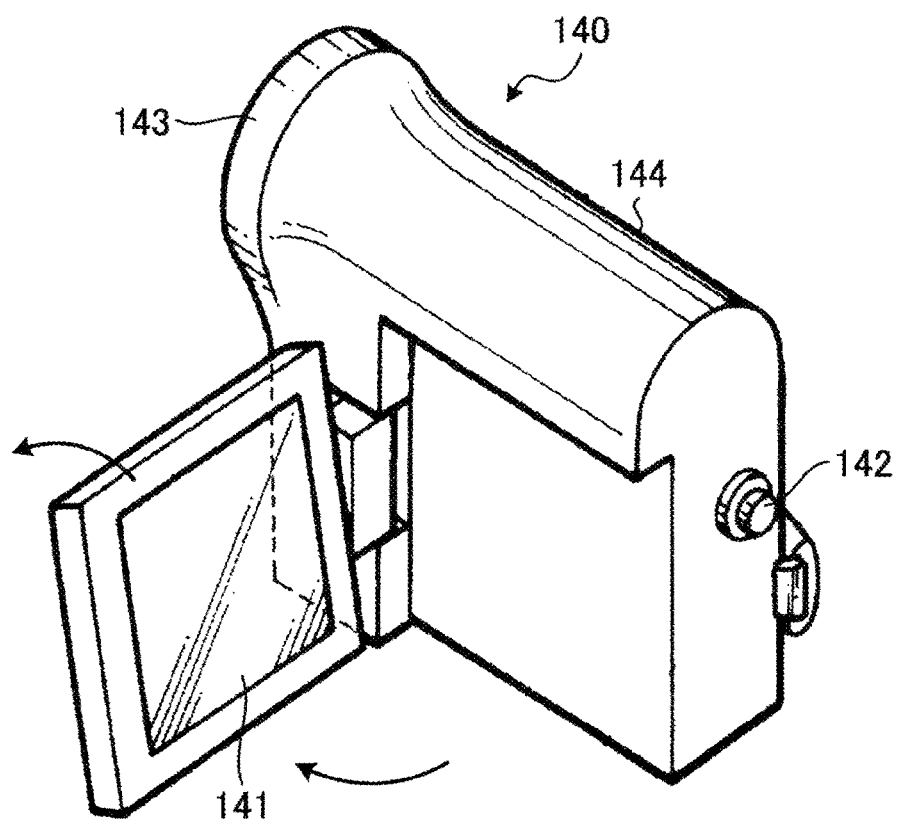
FIG. 24 is an explanatory view of an external appearance of a video camera to which the display device according to the embodiments is applied.

FIG. 24 is an explanatory view of an external appearance of a video camera to which the display device according to the embodiments is applied.

A video camera 70 has, for example, a display section 71, a start/stop switch 72, a lens 73, and a main body section 74, and the display section 71 includes the display device 10 according to each of the embodiments.

Application Example 5

Figure 25:
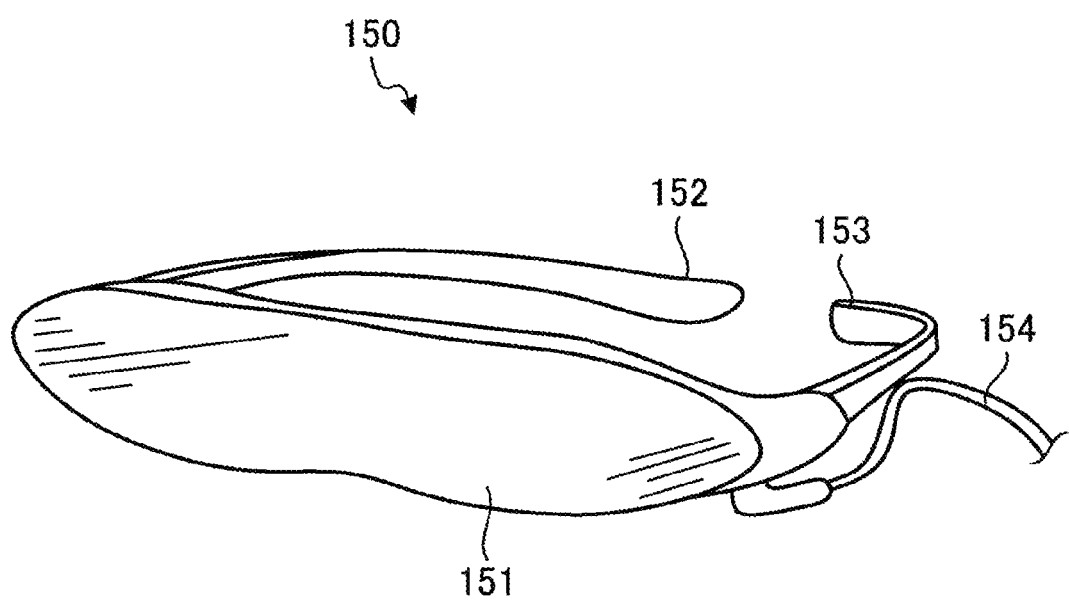
FIG. 25 is an explanatory view of an external appearance of a head mounted display to which the display device according to the embodiments is applied.

FIG. 25 is an explanatory view of an external appearance of a head mounted display to which the display device according to the embodiments is applied.

A head mounted display 80 includes, for example, a glass-type display section 81, ear-hanging members 82 and 83 provided on both sides of the display section 81 and for mounting the head mounted display 80 on the head of a user, and a cable section 84 for inputting a display signal to the head mounted display 80.

In the foregoing configuration, the display device 10 according to the embodiments is used as the display section 81.

In the foregoing, while preferred embodiments and modifications of the present technique have been described above as examples, the present technique is not limited to the embodiments and the like described above, and various changes can be made.

It should be noted that the advantageous effects described in this specification are merely illustrative and not restrictive. In addition, the present technique can provide advantageous effects other than those described in this specification.

It is to be noted that the present technique is also able to adopt the following configurations.

(1)
A light-emitting element including:
an anode electrode portion having a projecting-shaped side wall portion formed along a peripheral edge portion of an organic EL pixel;
an insulating film layer configured to cover an outer edge portion of the anode electrode portion so as to cover a side wall of the side wall portion on a light emitting unit side of the organic EL pixel in a predetermined film thickness;
an organic EL layer layered so as to cover the insulating film layer and an upper surface of the anode electrode portion; and
a cathode electrode portion layered over an upper surface of the organic EL layer.

(2)
The light-emitting element according to (1) above, in which
the anode electrode portion includes an anode electrode main body, and a side wall portion including an electrode material different from an electrode material of the anode electrode main body.

(3)
The light-emitting element according to (2) above, in which
the electrode material constituting the anode electrode main body adopts a material higher in processing selectivity than the electrode material of the side wall portion.

(4)
The light-emitting element according to (1) above, in which
the anode electrode portion includes an anode electrode main body, and an electrode portion that has a side wall portion including an electrode material different from an electrode material of the anode electrode main body and that is layered over an upper layer of the anode electrode main body.

(5)
The light-emitting element according to (4) above, in which
the anode electrode portion includes a first characteristic layer layered over the upper layer of the anode electrode main body.

(6)
The light-emitting element according to (5) above, in which
the anode electrode main body includes a material having a reflectance higher than a predetermined reflectance, and
the first characteristic layer includes a material having a carrier injection property higher than a predetermined carrier injection property.

(7)
The light-emitting element according to (1) above, in which
the anode electrode portion includes an anode electrode main body, a side wall portion including an electrode material different from an electrode material of the anode electrode main body, and a second characteristic layer layered under the anode electrode main body.

(8)
The light-emitting element according to (7) above, in which
the second characteristic layer adopts a material having high adhesiveness to a second insulating film on which the anode electrode portion is layered.

(9)
A light-emitting element including:
a first insulating film layer having a projecting portion along a peripheral edge portion of an organic EL pixel;
an anode electrode portion configured to cover the first insulating film layer and having a projecting-shaped side wall portion formed along the projecting portion;
a second insulating film layer configured to cover an outer edge portion of the anode electrode portion so as to cover a side wall of the side wall portion on a light emitting unit side of the organic EL pixel in a predetermined film thickness;
an organic EL layer layered so as to cover the insulating film layer and an upper surface of the anode electrode portion; and
a cathode electrode portion layered over an upper surface of the organic EL layer.

(10)
A light-emitting element including:
a first insulating film layer having a recess portion along a peripheral edge portion of an organic EL pixel;
an anode electrode portion configured to cover the first insulating film layer and having a projecting-shaped side wall portion formed along an outer peripheral portion of the recess portion;

a second insulating film layer configured to cover an outer edge portion of the anode electrode portion so as to cover a side wall of the side wall portion on a light emitting unit side of the organic EL pixel in a predetermined film thickness;

an organic EL layer layered so as to cover the insulating film layer and an upper surface of the anode electrode portion; and a cathode electrode portion layered over an upper surface of the organic EL layer.

(11)

The light-emitting element according to (1) to (10), in which upon drawing a straight line connecting from a point on a boundary between the anode electrode portion and the second insulating film layer to the cathode electrode portion at a shortest distance, an angle formed between the straight line and the upper surface of the anode electrode portion 23 is set to θ, and a thickness of the second insulating film layer which is opposed to an inner side wall portion of the side wall portion is set such that an angle formed between the upper surface of the anode electrode portion and an electric field vector formed in the point on the boundary when a given potential difference is applied between the anode electrode portion and the cathode electrode portion is equal to or smaller than θ.

(12)

A display device including:

a plurality of light-emitting elements arrayed in a matrix and each connected to a signal line and a scan line;

a signal line drive circuit configured to drive the signal line;

a scan line drive circuit configured to drive the scan line; and a current source configured to supply a current to the light-emitting elements, in which the light-emitting elements each includes an anode electrode portion having a projecting-shaped side wall portion formed along a peripheral edge portion of an organic EL pixel, an insulating film layer configured to cover an outer edge portion of the anode electrode portion so as to cover a side wall of the side wall portion on a light emitting unit side of the organic EL pixel in a predetermined film thickness, an organic EL layer layered so as to cover the insulating film layer and an upper surface of the anode electrode portion, and a cathode electrode portion layered over an upper surface of the organic EL layer.

(13)

The display device according to (12), in which the organic EL pixel includes a resonator structure which resonates light generated in a light emitting unit.

(14)

Electronic equipment including:

a display device according to (12).

REFERENCE SIGNS LIST

10: Display device
11R, 11G, 11B: Organic EL pixel element
12: Signal line drive circuit
13: Scan line drive circuit
14: Current source
21: First insulating film layer
22: Side wall portion
22A: Outer side wall portion
22C: Inner side wall portion
23: Anode electrode portion
24: Second insulating film layer
25: Organic EL layer
26: Cathode electrode portion
31, $31_R$, $31_G$, $31_B$: First electrode
40, $40_R$, $40_G$, $40_B$: Organic layer
61: Second electrode
71, $71_R$, $71_G$, $71_B$: Reflection plate
$72_R$, $72_G$, $72_B$: Optical adjustment layer
73: Surface of base layer
$74_R$, $74_G$, $74_B$: Oxide film

The invention claimed is:

1. A light-emitting element comprising:
a first insulating film layer extending contiguously along a first direction between a first peripheral edge and a second peripheral edge of an organic EL pixel, the first insulating film layer including a projecting portion located at the first peripheral edge of the organic EL pixel and extending upwards along a second direction perpendicular to the first direction;
an anode electrode portion configured to cover the first insulating film layer and including a projecting-shaped side wall portion formed along the projecting portion;
a second insulating film layer configured to cover an outer edge portion of the anode electrode portion so as to cover the projecting-shaped side wall portion of the anode electrode portion;
an organic EL layer that is layered so as to cover an upper surface of the second insulating film layer and an upper surface of the anode electrode portion; and
a cathode electrode portion layered over an upper surface of the organic EL layer.

2. The light-emitting element according to claim 1, wherein the organic EL layer is layered to cover the second insulating film layer along an entirety of the projecting portion.

3. The light-emitting element according to claim 2, wherein the organic EL layer is layered above the anode electrode portion along the projecting portion with the second insulating film layer being located between the anode electrode portion and the organic EL layer along the entirety of the projecting portion.

4. The light-emitting element according to claim 1, wherein the anode electrode portion includes indium tin oxide, indium oxide or indium-gallium-zinc-oxide.

5. The light-emitting element according to claim 1, wherein the first insulating film layer includes another projecting portion that extends upwards along the second direction and that is located at the second peripheral edge of the organic EL pixel.

6. The light-emitting element according to claim 1, wherein the organic EL layer (25) is in contact with the upper surface of the second insulating film layer at the projecting portion and in contact with the upper surface of the anode electrode portion between the first and second peripheral edges.

7. A display device comprising a light-emitting element according to claim 1.

8. The display device according to claim 7, wherein the organic EL layer is layered to cover the second insulating film layer along an entirety of the projecting portion.

9. The display device according to claim 8, wherein the organic EL layer is layered above the anode electrode portion along the projecting portion with the second insulating film layer being located between the anode electrode portion and the organic EL layer along the entirety of the projecting portion.

10. The display device according to claim 7, wherein the anode electrode portion includes indium tin oxide, indium oxide or indium-gallium-zinc-oxide.

11. The display device according to claim 7, wherein the first insulating film layer includes another projecting portion that extends upwards along the second direction and that is located at the second peripheral edge of the organic EL pixel.

12. The display device according to claim 7, wherein the organic EL layer is in contact with the upper surface of the second insulating film layer at the projecting portion and in contact with the upper surface of the anode electrode portion between the first and second peripheral edges.

13. An electronic equipment comprising the display device according to claim 7.

14. The electronic equipment according to claim 13, wherein the organic EL layer is layered to cover the second insulating film layer along an entirety of the projecting portion.

15. The electronic equipment according to claim 14, wherein the organic EL layer is layered above the anode electrode portion along the projecting portion with the second insulating film layer being located between the anode electrode portion and the organic EL layer along the entirety of the projecting portion.

16. The electronic equipment according to claim 13, wherein the anode electrode portion includes indium tin oxide, indium oxide or indium-gallium-zinc-oxide.

17. The electronic equipment according to claim 13, wherein the first insulating film layer includes another projecting portion that extends upwards along the second direction and that is located at the second peripheral edge of the organic EL pixel.

18. The electronic equipment according to claim 13, wherein the organic EL layer is in contact with the upper surface of the second insulating film layer at the projecting portion and in contact with the upper surface of the anode electrode portion between the first and second peripheral edges.

* * * * *